United States Patent
Nishiyama

(10) Patent No.: US 7,480,595 B2
(45) Date of Patent: Jan. 20, 2009

(54) SYSTEM ESTIMATION METHOD AND PROGRAM, RECORDING MEDIUM, AND SYSTEM ESTIMATION DEVICE

(75) Inventor: Kiyoshi Nishiyama, Morioka (JP)

(73) Assignee: Japan Science and Technology Agency (JP)

( * ) Notice: Subject to any disclaimer, the term of this patent is extended or adjusted under 35 U.S.C. 154(b) by 229 days.

(21) Appl. No.: 10/567,514

(22) PCT Filed: May 8, 2004

(86) PCT No.: PCT/JP2004/011568

§ 371 (c)(1),
(2), (4) Date: Aug. 14, 2006

(87) PCT Pub. No.: WO2005/015737

PCT Pub. Date: Feb. 17, 2005

(65) Prior Publication Data

US 2007/0185693 A1    Aug. 9, 2007

(30) Foreign Application Priority Data

Aug. 11, 2003    (JP)    ............................. 2003-291614

(51) Int. Cl.
*G06F 17/50* (2006.01)

(52) U.S. Cl. .......................................... 703/1; 367/901
(58) Field of Classification Search ..................... 703/1; 367/901
See application file for complete search history.

(56) References Cited

U.S. PATENT DOCUMENTS 5,394,322 A    2/1995    Hansen
(Continued)

FOREIGN PATENT DOCUMENTS

JP    61-200713    9/1986
(Continued)

OTHER PUBLICATIONS

Nishiyama et al. "H(infinity) learning of Layered Neural Networks", IEEE 2001.*
(Continued)

*Primary Examiner*—Kamini S Shah
*Assistant Examiner*—Saif A Alhija
(74) *Attorney, Agent, or Firm*—Thomas W Tolpin; Tolpin & Partners, PC

(57) ABSTRACT

It is possible to establish an estimation method capable of logically and optimally deciding a forgetting coefficient and develop an estimation algorithm and a high-speed algorithm which are numerically stable. Firstly, a Processing section reads out or receives an upper limit value $\gamma_f$ from a storage section or an input section (S101). The processing section decides a forgetting coefficient $\rho$ by equation (15) (S103). After this, according to the forgetting coefficient $\rho$, the processing section executes a hyper $H_\infty$ filter of equations (10-13) (S105). The processing section (101) calculates the existence condition of equation (17) (or equation (18) which will be given later) (S107). When the existence condition is satisfied at all the times (S109), $\gamma_f$ is decreased by $\Delta\gamma$ and the same processing is repeated (S111). On the other hand, when the existence condition is not satisfied by a certain $\gamma_f$ (S109), the $\Delta\gamma$ is added to the $\gamma_f$ and the sum is output to an output section and/or stored in the storage section as an optimal value $\gamma_f^{OP}$ of the $\gamma_f$ (S113).

15 Claims, 10 Drawing Sheets

U.S. PATENT DOCUMENTS

| | | | |
|---|---|---|---|
| 5,987,444 | A | 11/1999 | Lo |
| 5,995,620 | A | 11/1999 | Wigren |
| 6,711,598 | B1 | 3/2004 | Paré, Jr. |
| 6,801,881 | B1 | 10/2004 | Shah |

FOREIGN PATENT DOCUMENTS

| | | |
|---|---|---|
| JP | 07-110693 | 4/1995 |
| JP | 07-185625 | 7/1995 |
| JP | 2002-135171 | 5/2002 |

OTHER PUBLICATIONS

Nishiyama "Robust Estimation of a Single Complex Sinusoid in White Noise-H Filter Approach", IEEE 1999.*

Nishiyama "A Nonlinear Filter for Estimating a Sinusoidal Signal and Its Parameters in White Noise: On the Case of a Single Sinusoid", IEEE 1997.*

Publication: "*Robust Estimation of a Single Complex Sinusoid In White Noise—$H_\infty$ Filtering Approach*", by Kiyoshi Nishiyama, IEEE Transaction on Single Processing, vol. 47, No. 10, Oct. 1999.

Publication: "*$H_\infty$-Learning of Layered Neural Networks*", by Nishiyama et al., IEEE Transactions on Nueral Networks, vol. 12, No. 6, Nov. 2001.

Publication: "*Adaptive Filter Theory, Third Edition*" by Simon Haykin, Kalman Filters, Chap. 7, p. 320-321, Prentice Hall Information and Sciences Series.

Publications: "*Indefinite-Quadratic Estimation and Control, A Unified Approach to $H^2$ and $H^\infty$ Theories*", by Hassibi et al., Studies in Applied and Numerical Mathematics, Chapter 1, pp. 4-21.

Publication: "*A State-Space Approach To Adaptive RLS Filtering*" by Ali H. Sayed and Thomas Kailath, published by IEEE Signal Processing Magazine, Jul. 1994, pp. 18-60.

Publication: "*A Fast Filter And Its Tracking Performace For Time-Varying System Identification*" by Kiyoshih Nishiyama of Dep. Of Comp & Info. Science, Faculty of Engineering, Iwate University, Japan, published by Proceeding of 15th Digital Signal Processing Symposium, pp. 191-196, Iwate, Japan.

Publication: "Digital Signal Processing Handbook", 1993, pp. 419-423 and 177-190.

PCT International Search Report mailed Nov. 22, 2004, PCT/ISA/210,220, 237 for International PCT Patent Application No. PCT/JP2004/011568 filed Aug. 5, 2004, International Publication No. WO 2005/015737 A1 published Feb. 17, 2005.

PCT International Preliminary Examination Report of Jun. 9, 2005, PCT/IPEA 401, 408, 409, 416 for International PCT Patent Application No. PCT/JP2004/011568 filed Aug. 5, 2004, International Publication No. WO 2005/015737 A1 published Feb. 17, 2005.

Publication: Translation of PCT International Preliminary Report on Patentability for International Application No. PCT/JP2004/011568, filed on Aug. 5, 2004.

* cited by examiner

IMPULSE RESPONSE OF ECHO PATH

| $h_0$ | $h_1$ | $h_2$ | $h_3$ | $h_4$ | $h_5$ |
|---|---|---|---|---|---|
| 0.0 | 0.008 | -0.012 | 0.064 | 0.013 | -0.052 |
| $h_6$ | $h_7$ | $h_8$ | $h_9$ | $h_{10}$ | $h_{11}$ |
| -0.007 | 0.039 | 0.011 | 0.0 | -0.002 | -0.009 |
| $h_{12}$ | $h_{13}$ | $h_{14}$ | $h_{15}$ | $h_{16}$ | $h_{17}$ |
| -0.016 | -0.013 | -0.001 | 0.004 | 0.015 | 0.013 |
| $h_{18}$ | $h_{19}$ | $h_{20}$ | $h_{21}$ | $h_{22}$ | $h_{23}$ |
| 0.007 | 0.0 | -0.001 | -0.002 | -0.001 | 0.0 |

FIG. 6

(a) ESTIMATED VALUE OF IMPULSE RESPONSE (b) TRANSITION OF TAP ERROR (a) OUTPUT ERROR SYSTEM (b) STRUCTURE OF ADAPTIVE FILTER

SYSTEM ESTIMATION METHOD AND PROGRAM, RECORDING MEDIUM, AND SYSTEM ESTIMATION DEVICE

CROSS REFERENCES TO RELATED APPLICATION

This application is a national phase application based upon priority International PCT Patent Application No. PCT/JP2004/011568 filed Aug. 05, 2004, International Publication No. WO 2005/015737 A1 published Feb. 17, 2005, which is based upon priority Japanese Application No. JP2003-291614 filed Aug. 11, 2003.

BACKGROUND OF THE INVENTION

1. Technical Field

The present invention relates to a system estimation method and program, a recording medium, and a system estimation device, and particularly to a system estimation method and program, a recording medium, and a system estimation device, in which the generation of robustness in state estimation and the optimization of a forgetting factor are simultaneously realized by using a fast $H_\infty$ filtering algorithm of a hyper $H_\infty$ filter developed on the basis of an $H_\infty$ evaluation criterion.

2. Background Art

In general, system estimation means estimating a parameter of a mathematical model (transfer function, impulse response, etc.) of an input/output relation of a system based on input/output data. Typical application examples include an echo canceller in international communication, an automatic equalizer in data communication, an echo canceller and sound field reproduction in a sound system, active noise control in a vehicle etc. and the like. For more information, see non-patent document 1: "DIGITAL SIGNAL PROCESSING HANDBOOK" 1993, The Institute of Electronics, Information and Communication Engineers, and the like.

(Basic Principle)

FIG. 8 shows an example of a structural view for system estimation (unknown system may be expressed by an IIR (Infinite Impulse Response) filter).

This system includes an unknown system 1 and an adaptive filter 2. The adaptive filter 2 includes an FIR digital filter 3 and an adaptive algorithm 4.

Hereinafter, an example of an output error method to identify the unknown system 1 will be described. Here, $u_k$ denotes an input of the unknown system 1, $d_k$ denotes an output of the system, which is a desired signal, and $d^\wedge_k$ denotes an output of the filter. (Incidentally, "^" means an estimated value and should be placed directly above a character, however, it is placed at the upper right of the character for input convenience. The same applies hereinafter.).

Since an impulse response is generally used as a parameter of an unknown system, the adaptive filter adjusts a coefficient of the FIR digital filter 3 by the adaptive algorithm so as to minimize an evaluation error $e_k = d_k - d^\wedge_k$ of the figure.

Besides, conventionally, a Kalman filter based on an update expression (Riccati equation) of an error covariance matrix has been widely used for the estimation of a parameter (state) of a system. The details are disclosed in non-patent document 2: S. Haykin: Adaptive filter theory, Prentice-Hall (1996) and the like.

Hereinafter, the basic principle of the Kalman filter will be described.

A minimum variance estimate $x^\wedge_{k|k}$ of a state $x_k$ of a linear system expressed in a state space model as indicated by the following expression:

$$x_{k+1} = \rho^{-1/2} x_k, \quad y_k = H_k x_k + v_k \tag{1}$$

is obtained by using an error covariance matrix $\Sigma^\wedge_{k|k-1}$ of the state as follows.

$$\hat{x}_{k|k} = \hat{x}_{k|k-1} + K_k(y_k - H_k \hat{x}_{k|k-1}) \tag{2}$$

$$\hat{x}_{k+1|k} = \rho^{-\frac{1}{2}} \hat{x}_{k|k}$$

$$K_k = \hat{\Sigma}_{k|k-1} H_k^T (\rho + H_k \hat{\Sigma}_{k|k-1} H_k^T)^{-1} \tag{3}$$

$$\hat{\Sigma}_{k|k} = \hat{\Sigma}_{k|k-1} - K_k H_k \hat{\Sigma}_{k|k-1}$$

$$\hat{\Sigma}_{k+1|k} = \hat{\Sigma}_{k|k} / \rho \tag{4}$$

where, $$\hat{x}_{0|-1} = 0, \quad \hat{\Sigma}_{0|-1} = \varepsilon_0 I, \quad \varepsilon_0 > 0 \tag{5}$$

$x_k$: State vector or simply a state; unknown and this is an object of estimation.
$y_k$: Observation signal; input of a filter and known.
$H_k$: Observation matrix; known.
$V_k$: Observation noise; unknown.
$\rho$: Forgetting factor; generally determined by trial and error.
$K_k$: Filter gain; obtained from matrix $\Sigma^\wedge_{k|k-1}$.
$\Sigma^\wedge_{k|k}$: Corresponds to the covariance matrix of an error of $x^\wedge_{k|k}$; obtained by a Riccati equation.
$\Sigma^\wedge_{k+1|k}$: Corresponds to the covariance matrix of an error of $x^\wedge_{k+1|k}$; obtained by the Riccati equation.
$\Sigma^\wedge_{1|0}$: Corresponds to the covariance matrix in an initial state; although originally unknown, $\epsilon_0 I$ is used for convenience.

The present inventor has already proposed a system identification algorithm by a fast $H_\infty$ filter (see patent document 1). This is such that an $H_\infty$ evaluation criterion is newly determined for system identification, and a fast algorithm for the hyper $H_\infty$ filter based thereon is developed, while a fast time-varying system identification method based on this fast $H_\infty$ filtering algorithm is proposed. The fast $H_\infty$ filtering algorithm can track a time-varying system which changes rapidly with a computational complexity of O (N) per unit-time step. It matches perfectly with a fast Kalman filtering algorithm at the limit of the upper limit value. By the system identification as stated above, it is possible to realize the fast real-time identification and estimation of the time-invariant and time-varying systems.

Incidentally, with respect to methods normally known in the field of the system estimation, see, for example, non-patent documents 2 and 3.

(Applied Example to Echo Canceller)

In a long distance telephone circuit such as an international telephone, a four-wire circuit is used from the reason of signal amplification and the like. On the other hand, since a subscriber's circuit has a relatively short distance, a two-wire circuit is used.

FIG. 9 is an explanatory view concerning a communication system and an echo. A hybrid transformer as shown in the figure is introduced at a connection part between the two-wire circuit and the four-wire circuit, and impedance matching is performed. When the impedance matching is complete, a signal (sound) from a speaker B reaches only a speaker A. However, in general, it is difficult to realize the complete matching, and there occurs a phenomenon in which part of the received signal leaks to the four-wire circuit, and returns to the receiver (speaker A) after being amplified. This is an echo (echo). As a transmission distance becomes long (as a delay time becomes long), the influence of the echo becomes large, and the quality of a telephone call is remarkably deteriorated (in the pulse transmission, even in the case of short distance, the echo has a large influence on the deterioration of a telephone call).

FIG. 10 is a principle view of an echo canceller.

Then, as shown in the figure, the echo canceller (echo canceller) is introduced, an impulse response of an echo path is successively estimated by using a received signal which can be directly observed and an echo, and a pseudo-echo obtained by using it is subtracted from the actual echo to cancel the echo and to remove it.

The estimation of the impulse response of the echo path is performed so that the mean square error of a residual echo $e_k$ becomes minimum. At this time, elements to interfere with the estimation of the echo path are circuit noise and a signal (sound) from the speaker A. In general, when two speakers simultaneously start to speak (double talk), the estimation of the impulse response is suspended. Besides, since the impulse response length of the hybrid transformer is about 50 [ms], when the sampling period is made 125 [μs], the order of the impulse response of the echo path becomes actually about 400.

Non-patent document 1
"DIGITAL SIGNAL PROCESSING HANDBOOK" 1993 The Institute of Electronics, Information and Communication Engineers Non-patent document 2
S. Haykin: Adaptive filter theory, Prentice-Hall (1996)

Non-patent document 3
B. Hassibi, A. H. Sayed, and T. Kailath: "Indefinite-Quadratic Estimation and Control", SIAM $(_{1996})$ Patent document $_1$
JP-A-$_{2002}$-$_{135171}$

BRIEF SUMMARY OF INVENTION

However, in the conventional Kalman filter including the forgetting factor ρ as in the expressions (1) to (5), the value of the forgetting factor ρ must be determined by trial and error and a very long time has been required. Further, there has been no means for judging whether the determined value of the forgetting factor ρ is an optimal value.

Besides, with respect to the error covariance matrix used in the Kalman filter, it is known that a quadratic form to an arbitrary vector, which is originally not zero, is always positive (hereinafter referred to as "positive definite"), however, in the case where calculation is performed by a computer at single precision, the quadratic form becomes negative (hereinafter referred to as "negative definite"), and becomes numerically unstable. Besides, since the amount of calculation is $O(N^2)$ (or $O(N^3)$), in the case where the dimension N of the state vector $x_k$ is large, the number of times of arithmetic operation per time step is rapidly increased, and it has not been suitable for a real-time processing.

In view of the above, the present invention has an object to establish an estimation method which can theoretically optimally determine a forgetting factor, and to develop an estimation algorithm and a fast algorithm which are numerically stable. Besides, the invention has an object to provide a system estimation method which can be applied to an echo canceller in a communication system or a sound system, sound field reproduction, noise control and the like.

In order to solve the problem, according to the invention, a newly devised $H_\infty$ optimization method is used to derive a state estimation algorithm in which a forgetting factor can be optimally determined. Further, instead of an error covariance matrix which should always have the positive definite, its factor matrix is updated, so that an estimation algorithm and a fast algorithm, which are numerically stable, are developed.

According to first solving means of the invention, a system estimation method and program and a computer readable recording medium recording the program are for making state estimation robust and optimizing a forgetting factor ρ simultaneously in an estimation algorithm, in which for a state space model expressed by following expressions:

$$x_{k+1}=F_k x_k + G_k w_k$$

$$y_k = H_k x_k + v_k$$

$$z_k = H_k x_k$$

here,
$x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix, a maximum energy gain to a filter error from a disturbance weighted with the forgetting factor ρ as an evaluation criterion is suppressed to be smaller than a term corresponding to a previously given upper limit value $γ_f$, and the system estimation method, the system estimation program for causing a computer to execute respective steps, and the computer readable recording medium recording the program, includes a step at which a processing section inputs the upper limit value $γ_f$, the observation signal $y_k$ as an input of a filter and a value including an observation matrix $H_k$ from a storage section or an input section, a step at which the processing section determines the forgetting factor ρ relevant to the state space model in accordance with the upper limit value $γ_f$, a step at which the processing section reads out an initial value or a value including the observation matrix $H_k$ at a time from the storage section and uses the forgetting factor ρ to execute a hyper $H_\infty$ filter expressed by a following expression:

$$\hat{x}_{k|k} = F_{k-1}\hat{x}_{k-1|k-1} = K_{s,k}(y_k - H_k F_{k-1}\hat{x}_{k-1|k-1})$$

here,
$\hat{x}_{k|k}$: an estimated value of a state $x_k$ at a time k using observation signals $y_0$ to $y_k$,
$F_k$: dynamics of the system, and
$K_{s,k}$: a filter gain, a step at which the processing section stores an obtained value relating to the hyper $H_\infty$ filter into the storage section, a step at which the processing section calculates an existence condition based on the upper limit value $γ_f$ and the forgetting factor ρ by the observation matrix $H_i$ and the filter gain $K_{s,i}$, and a step at which the processing section sets the upper limit value to be small within a range where the existence condition is satisfied at each time and stores the value into the storage section by decreasing the upper limit value $γ_f$ and repeating the step of executing the hyper $H_\infty$ filter.

Besides, according to second solving means of the invention, a system estimation device is for making state estimation robust and optimizing a forgetting factor ρ simultaneously in an estimation algorithm, in which for a state space model expressed by following expressions:

$$x_{k+1} = F_k x_k + G_k w_k$$

$$y_k = H_k x_k + v_k$$

$$z_k = H_k x_k$$

here, $x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix, a maximum energy gain to a filter error from a disturbance weighted with the forgetting factor ρ as an evaluation criterion is suppressed to be smaller than a term corresponding to a previously given upper limit value $\gamma_f$, the system estimation device includes:

a processing section to execute the estimation algorithm; and a storage section to which reading and/or writing is performed by the processing section and which stores respective observed values, set values, and estimated values relevant to the state space model, the processing section inputs the upper limit value $\gamma_f$, the observation signal $y_k$ as an input of a filter and a value including an observation matrix $H_k$ from the storage section or an input section, the processing section determines the forgetting factor ρ relevant to the state space model in accordance with the upper limit value $\gamma_f$, the processing section reads out an initial value or a value including the observation matrix $H_k$ at a time from the storage section and uses the forgetting factor ρ to execute a hyper $H_\infty$ filter expressed by a following expression:

$$\hat{x}_{k|k} = F_{k-1}\hat{x}_{k-1|k-1} = K_{s,k}(y_k - H_k F_{k-1}\hat{x}_{k-1|k-1})$$

here, $\hat{x}_{k|k}$; an estimated value of a state $x_k$ at a time k using observation signals $y_0$ to $y_k$,
$F_k$: dynamics of the system, and
$K_{s,k}$; a filter gain, the processing section stores an obtained value relating to the hyper $H_\infty$ filter into the storage section, the processing section calculates an existence condition based on the upper limit value $\gamma_f$ and the forgetting factor ρ by the observation matrix $H_t$ and the filter gain $K_{s,i}$, and the processing part sets the upper limit value to be small within a range where the existence condition is satisfied at each time and stores the value into the storage section by decreasing the upper limit value $\gamma_f$ and repeating the step of executing the hyper $H_\infty$ filter.

According to the estimation method of the invention, the forgetting factor can be optimally determined, and the algorithm can stably operate even in the case of single precision, and accordingly, high performance can be realized at low cost. In general, in a normal civil communication equipment, calculation is often performed at single precision in view of cost and speed. Thus, as the practical state estimation algorithm, the invention would have effects in various industrial fields.

A more detailed description of the invention is provided in the following description and appended claims taken in conjunction with the accompanying drawing.

BRIEF DESCRIPTION OF THE DRAWINGS

FIG. 6 is a view showing values of an impulse response $\{h_i\}_{i=0}^{23}$.

DETAILED DESCRIPTION OF THE INVENTION

The following is a detailed description and explanation of the preferred embodiments and best modes for embodying the invention along with some proofs thereof.

Hereinafter, embodiments of the invention will be described.

1. Explanation of Symbols

First, main symbols used in the embodiments of the invention and whether they are known or unknown will be described.

$x_k$: State vector or simply a state; unknown and this is an object of the estimation.
$x_o$: Initial state; unknown.
$w_k$: System noise; unknown.
$v_k$: Observation noise; unknown.
$y_k$: Observation signal; input of a filter and known.
$z_k$: Output signal; unknown.
$F_k$: Dynamics of a system; known.
$G_k$: Drive matrix; known at the time of execution.
$H_k$: Observation matrix; known.
$\hat{x}_{k|k}$: Estimated value of a state $x_k$ at a time k, using observation signals $y_0$ to $y_k$; given by a filter equation.
$\hat{x}_{k+1|k}$: Estimated value of a state $x_{k+1}$ at a time k+1 using the observation symbols $y_0$ to $y_k$; given by the filter equation.
$\hat{x}_{0|0}$: Initial estimated value of a state; originally unknown, however, 0 is used for convenience.
$\hat{\Sigma}_{k|k}$: Corresponds to a covariance matrix of an error of $\hat{x}_{k|k}$; given by a Riccati equation.
$\hat{\Sigma}_{k+1|k}$: Corresponds to a covariance matrix of an error of $\hat{x}_{k+1|k}$; given by the Riccati equation.
$\hat{\Sigma}_{1|0}$: Corresponds to a covariance matrix in an initial state; originally unknown, however, $\epsilon_0 I$ is used for convenience.
$K_{s,k}$: Filter gain; obtained from a matrix $\hat{\Sigma}_{k|k-1}$.

ρ: Forgetting factor; in the case of Theorems 1 to 3, when $\gamma_f$ is determined, it is automatically determined by $\rho=1-\chi(\gamma_f)$.

$e_{f,i}$: Filter error $R_{e,k}$: Auxiliary variable

Incidentally, "^" and "v" placed above the symbol mean estimated values. Besides, "~", "-", "U" and the like are symbols added for convenience. Although these symbols are placed at the upper right of characters for input convenience, as indicated in mathematical expressions, they are the same as those placed directly above the characters. Besides, x, w and the like are vectors, H, G, K, R, Σ and the like are matrices and should be expressed by thick letters as indicated in the mathematical expressions, however, they are expressed in normal letters for input convenience.

2. Hardware and Program for System Estimation

The system estimation or the system estimation device and system can be provided by a system estimation program for causing a computer to execute respective procedures, a computer readable recording medium recording the system estimation program, a program product including the system estimation program and capable of being loaded into an internal memory of a computer, a computer, such as a server, including the program, and the like.

Figure 1:
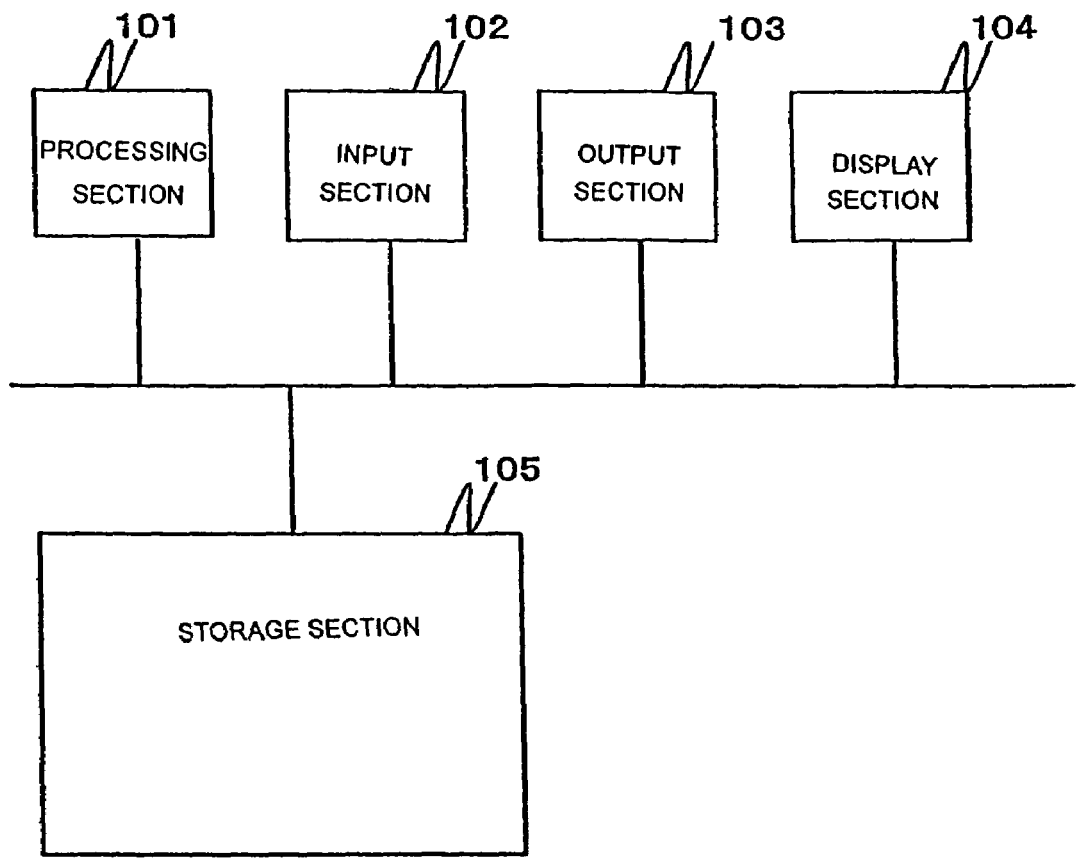
FIG. 1 is a structural view of hardware of an embodiment.

FIG. 1 is a structural view of hardware of this embodiment.

This hardware includes a processing section 101 which is a central processing unit (CPU), an input section 102, an output section 103, a display section 104 and a storage section 105. Besides, the processing section 101, the input section 102, the output section 103, the display section 104 and the storage section 105 are connected by suitable connection means such as a star or a bus. Known data indicated in "1. Explanation of Symbols" and subjected to the system estimation are stored in the storage section 105 as the need arises. Besides, unknown and known data, calculated data relating to the hyper $H_\infty$ filter, and other data are written and/or read by the processing section 101 as the need arises.

3. Hyper $H_\infty$ Filter by Which Forgetting Factor Can Be Optimally Determined (Theorem 1)

Consideration is given to a state space model as indicated by following expressions.

$$x_{k+1} = F_k x_k + G_k w_k, \quad x_k \in R^N \quad (6)$$

$$y_k = H_k x_k + v_k, \quad y_k, v_k \in R \quad (7)$$

$$z_k = H_k x_k, \quad z_k \in R, H_k \in R^{1\times N}, k=0,1,\ldots,L \quad (8)$$

An $H_\infty$ evaluation criterion as indicated by the following expression is proposed for the state space model as described above.

$$\sup_{x_0, \{w_i\}, \{v_i\}} \cdot \frac{\sum_{i=0}^{k} \|e_{f,i}\|^2 / \rho}{\|x_0 - \hat{x}_{0|-1}\|_{\Sigma_0^{-1}}^2 + \sum_{i=0}^{k} \|w_i\|^2 + \sum_{i=0}^{k} \|v_i\|^2 / \rho} < \gamma_f^2 \quad (9)$$

A state estimated value $\hat{x}_{k|k}$ (or an output estimated value $\check{z}_{k|k}$) to satisfy this $H_\infty$ evaluation criterion is given by a hyper $H_\infty$ filter of level $\gamma_f$.

$$\check{z}_{k|k} = H_k \hat{x}_{k|k} \quad (10)$$

$$\hat{x}_{k|k} = F_{k-1}\hat{x}_{k-1|k-1} + K_{s,k}(y_k - H_k F_{k-1}\hat{x}_{k-1|k-1}) \quad (11)$$

$$K_{s,k} = \hat{\Sigma}_{k|k-1} H_k^T \cdot (H_k \hat{\Sigma}_{k|k-1} H_k^T + \rho)^{-1} \quad (12)$$

$$\left.\begin{array}{l}\hat{\Sigma}_{k|k} = \hat{\Sigma}_{k|k-1} - \hat{\Sigma}_{k|k-1} C_k^T R_{e,k}^{-1} C_k \hat{\Sigma}_{k|k-1} \\ \hat{\Sigma}_{k+1|k} = (F_k \hat{\Sigma}_{k|k} F_k^T)/\rho \end{array}\right\} \quad (13)$$

where, $$e_{f,i} = \check{z}_{i|i} - H_i x_i, \quad \hat{x}_{0|0} = \check{x}_0, \quad \hat{\Sigma}_{1|0} = \Sigma_0 \quad (14)$$

$$R_{e,k} = R_k + C_k \hat{\Sigma}_{k|k-1} C_k^T, \quad R_k = \begin{bmatrix} \rho & 0 \\ 0 & -\rho\gamma_f^2 \end{bmatrix}, \quad C_k = \begin{bmatrix} H_k \\ H_k \end{bmatrix}$$

$$0 < \rho = 1 - \chi(\gamma_f) \leq 1, \quad \gamma_f > 1 \quad (15)$$

Incidentally, expression (11) denotes a filter equation, expression (12) denotes a filter gain, and expression (13) denotes a Riccati equation.

Besides, a drive matrix $G_k$ is generated as follows.

$$G_k G_k^T = \frac{\chi(\gamma_f)}{\rho} F_k \hat{\Sigma}_{k|k} F_k^T \quad (16)$$

Besides, in order to improve the tracking capacity of the foregoing $H_\infty$ filter, the upper limit value $\gamma_f$ is set to be as small as possible so as to satisfy the following existence condition.

$$\hat{\Sigma}_{i|i}^{-1} = \hat{\Sigma}_{i|i-1}^{-1} + \frac{1-\gamma_f^{-2}}{\rho} H_i^T H_i > 0, \quad i=0,\ldots,k \quad (17)$$

Where, $\chi(\gamma_f)$ is a monotonically damping function of $\gamma_f$, which satisfies $\chi(1)=1$ and $\chi(\infty)=0$.

The feature of Theorem 1 is that the generation of robustness in the state estimation and the optimization of the forgetting factor ρ are simultaneously performed.

Figure 2:
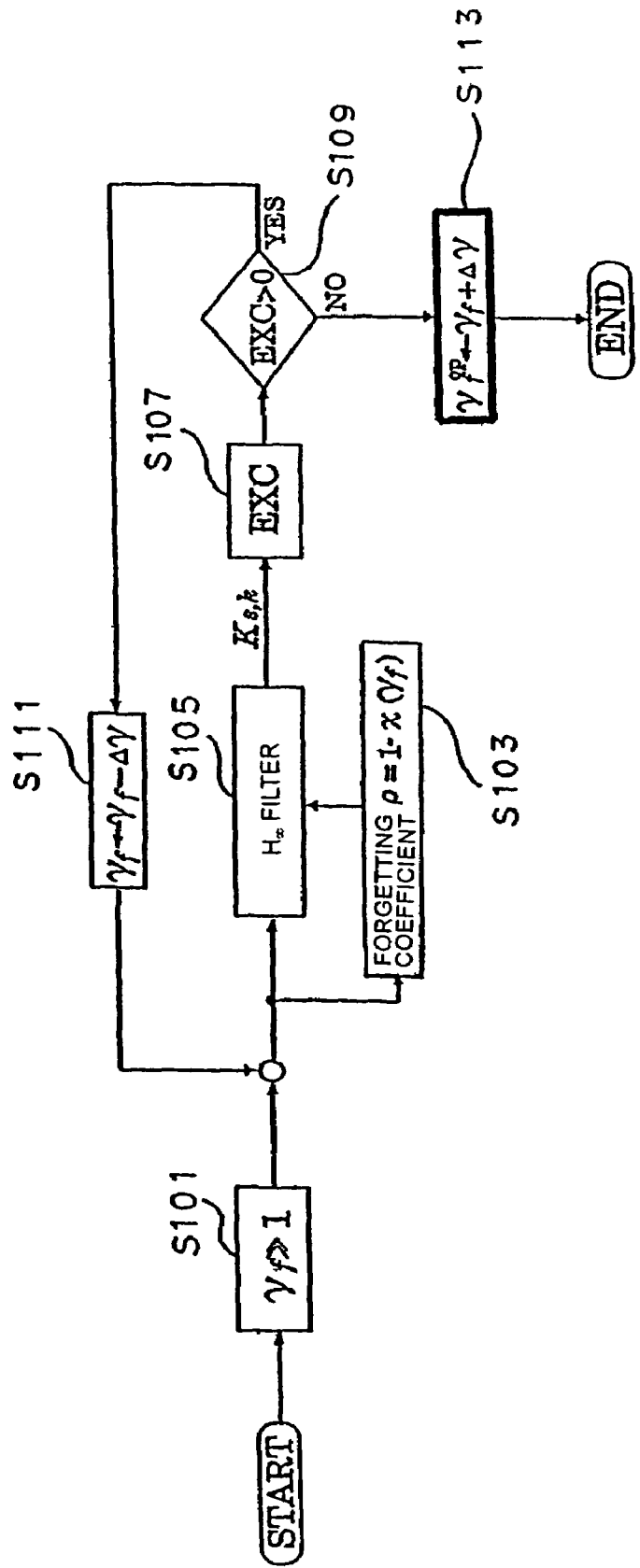
FIG. 2 is a flowchart concerning the generation of robustness of an $H_\infty$ filter and the optimization of a forgetting factor ρ.

FIG. 2 shows a flowchart concerning the generation of robustness of the $H_\infty$ filter and the optimization of the forgetting factor ρ. Here, block "EXC>0": an existence condition of the $H_\infty$ filter, and Δγ: a positive real number.

First, the processing section 101 reads out or inputs the upper limit value $\gamma_f$ from the storage section 105 or the input section 102 (S101). In this example, $\gamma_f \gg 1$ is given. The processing section 101 determines the forgetting factor ρ by expression (15) (S103). Thereafter, the processing section 101 executes the hyper $H_\infty$ filter of expression (10) to expression (13) based on the forgetting factor ρ (S105). The processing section 101 calculates expression (17) (or the right side (this is made EXC) of after-mentioned expression (18)) (S107), and when the existence condition is satisfied at all times (S109), $\gamma_f$ is decreased by Δγ, and the same processing is repeated (S111). On the other hand, when the existence condition is not satisfied at a certain $\gamma_f$ (S109), what is obtained by adding Δγ to the $\gamma_f$ is made the optimal value $\gamma_f^{op}$ of $\gamma_f$, and is outputted to the output section 103 and/or stored into the storage section 105 (S113). Incidentally, in this example, although Δγ is added, a previously set value other than that may be added. This optimization process is called a γ-iteration. Incidentally, the processing section 101 may store a suitable intermediate value and a final value obtained at respective steps, such as the $H_\infty$ filter calculation step S105 and the existence condition calculation step S107, into the storage section 105 as the need arises, and may read them from the storage section 105.

When the hyper $H_\infty$ filter satisfies the existence condition, the inequality of expression (9) is always satisfied. Thus, in the case where the disturbance energy of the denominator of expression (9) is limited, the total sum of the square estimated error of the numerator of expression (9) becomes bounded, and the estimated error after a certain time becomes 0. This means that when $\gamma_f$ can be made smaller, the estimated value $\hat{x}_{k|k}$ can quickly follow the change of the state $x_k$.

Here, attention should be given to the fact that the algorithm of the hyper $H_\infty$ filter of Theorem 1 is different from that of the normal $H_\infty$ filter. Besides, when $\gamma_f \to \infty$, then $\rho=1$ and $G_k=0$, and the algorithm of the $H_\infty$ filter of Theorem 1 coincides with the algorithm of the Kalman filter.

Figure 3:
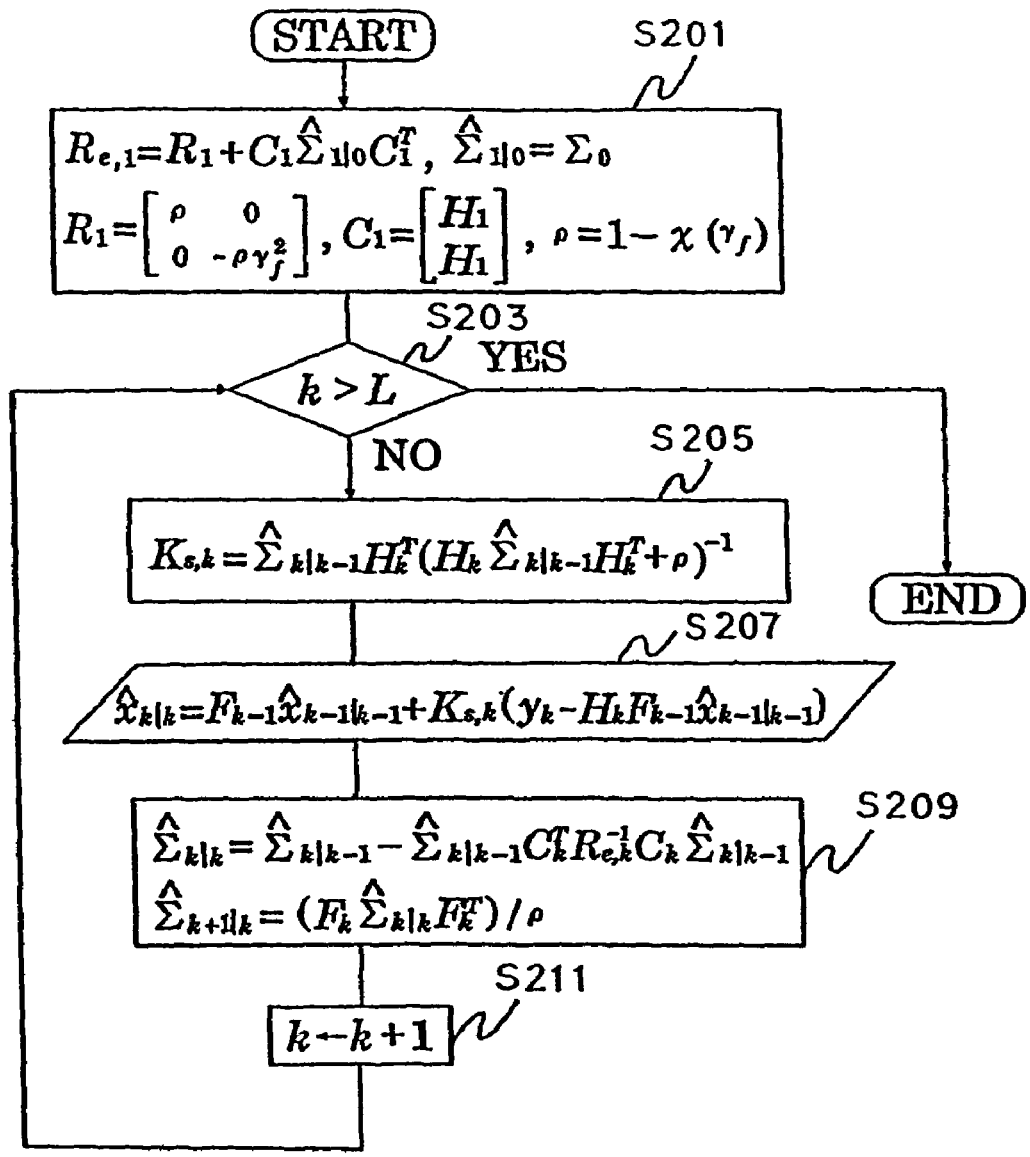
FIG. 3 is a flowchart of an algorithm of the $H_\infty$ filter (S105) in FIG. 2.

FIG. 3 is a flowchart of the algorithm of the (hyper) $H_\infty$ filter (S105) in FIG. 2.

The hyper $H_\infty$ filtering algorithm can be summarized as follows.

[Step S201] The processing section 101 reads out the initial condition of a recursive expression from the storage section 105 or inputs the initial condition from the input section 102, and determines it as indicated in the figure.

Incidentally, L denotes a previously fixed maximum data number.

[Step S203] The processing section 101 compares the time k with the maximum data number L. When the time k is larger than the maximum data number, the processing section 101 ends the processing, and when not larger, advance is made to a next step. (If unnecessary, the conditional sentence can be removed. Alternatively, restart may be made as the need arises.)

[Step S205] The processing section 101 calculates a filter gain $K_{s,k}$ by using expression (12).

[Step S207] The processing section 101 updates the filter equation of the hyper $H_\infty$ filter of expression (11).

[Step S209] The processing section 101 calculates terms $\hat{\Sigma}_{k|k}$, $\hat{\Sigma}_{k+1|k}$ corresponding to the covariance matrix of an error by using the Riccati equation of expression (13).

[Step S211] The time k is made to advance (k=k+1), return is made to step S203, and continuation is made as long as data exists.

Incidentally, the processing section 101 may store a suitable intermediate value, a final value, a value of the existence condition and the like obtained at the respective steps, such as the $H_\infty$ filter calculation steps S205 to S209, into the storage section 105 as the need arises, or may read them from the storage section 105.

(Scalar Existence Condition)

The amount of calculation $O(N^2)$ was necessary for the judgment of the existence condition of expression (17). However, when the following condition is used, the existence of the $H_\infty$ filter of Theorem 1, that is, expression (9) can be verified by the amount of calculation $O(N)$.

Corollary 1: Scalar existence condition

When the following existence condition is used, the existence of the hyper $H\infty$, filter can be judged by the amount of calculation $O(N)$.

$$-\varrho \hat{\Xi}_i + \rho \gamma_f^2 > 0, \quad i = 0, \ldots, k \quad (18)$$

Here, $$\varrho = 1 - \gamma_f^2, \quad \hat{\Xi}_i = \frac{\rho H_i K_{s,i}}{1 - H_i K_{s,i}}, \quad \rho = 1 - \chi(\gamma_f) \quad (19)$$

Where, $K_{s,i}$ denotes the filter gain obtained in expression (12).

(Proof)

Hereinafter, the proof of the system 1 will be described.

When a characteristic equation $$|\lambda I - R_{e,k}| = \begin{vmatrix} \lambda - (\rho + H_k \hat{\Sigma}_{k|k-1} H_k^T) & -H_k \hat{\Sigma}_{k|k-1} H_k^T \\ -H_k \hat{\Sigma}_{k|k-1} H_k^T & \lambda - (-\rho\gamma_f^2 + H_k \hat{\Sigma}_{k|k-1} H_k^T) \end{vmatrix}$$
$$= \lambda^2 - (2H_k \hat{\Sigma}_{k|k-1} H_k^T + \rho\varrho)\lambda - \rho^2 \gamma_f^2 + \rho\varrho H_k \hat{\Sigma}_{k|k-1} H_k^T = 0$$

of a 2×2 matrix $R_{e,k}$ is solved, an eigenvalue $\lambda_i$ of $R_{e,k}$ is obtained as follows.

$$\lambda_i = \frac{\Phi \pm \sqrt{\Phi^2 - 4\rho\varrho H_k \hat{\Sigma}_{k|k-1} H_k^T + 4\rho^2 \gamma_f^2}}{2}$$

Where, $\Phi = 2H_k \hat{\Sigma}_{k|k-1} H_k^T + \rho\varrho$, $\varrho = 1 - \gamma_f^2$ If $$-4\rho\varrho H_k \hat{\Sigma}_{k|k-1} H_k^T + 4\rho^2 \gamma_f^2 > 0$$

one of two eigenvalues of the matrix $R_{e,k}$ becomes positive, the other becomes negative, and the matrixes $R_k$ and $R_{e,k}$ have the same inertia. By this, when $$H_k \hat{\Sigma}_{k|k-1} H_k^T = \frac{H_k \tilde{K}_k}{1 - \frac{1 - \gamma_f^2}{\rho} H_k \tilde{K}_k},$$

$$H_k \tilde{K}_k = \frac{\rho H_k K_{s,k}}{1 - \gamma_f^2 H_k K_{s,k}}$$

is used, the existence condition of expression ($_{18}$) is obtained. Here, the amount of calculation of $H_k K_{s,k}$ is $O(N)$.

4. State Estimation Algorithm Which Is Numerically Stable

Since the foregoing hyper $H_\infty$ filter updates $\hat{\Sigma}_{k|k} \in R^{n \times n}$, the amount of calculation per unit time step becomes $O(N^2)$, that is, an arithmetic operation proportional to $N^2$ becomes necessary. Here, N denotes the dimension of the state vector $x_k$. Thus, as the dimension of $x_k$ is increased, the calculation time required for execution of this filter is rapidly increased. Besides, although the error covariance matrix $\hat{\Sigma}_{k|k-1}$ must always have the positive definite from its property, there is a case where it has numerically the negative definite. Especially, in the case where calculation is made at single precision, this tendency becomes remarkable. At this time, it is known that the filter becomes unstable. Thus, in order to put the algorithm to practical use and to reduce the cost, the development of the state estimation algorithm which can be operated even at single precision (example: 32 bit) is desired.

Then, next, attention is paid to $$R_k = R_k^{1/2} J_1 R_k^{T/2},$$

$$R_{e,k} = R_{e,k}^{1/2} J_1 R_{e,k}^{T/2},$$

$$\hat{\Sigma}_{k|k-1} = \hat{\Sigma}_{k|k-1}^{1/2} \hat{\Sigma}_{k|k-1}^{T/2}$$

and an $H_\infty$ filter (square root array algorithm) of Theorem $_1$, which is numerically stabilized, is indicated in Theorem 2. Here, although it is assumed that $F_k = I$ is established for simplification, it can be obtained in the same way also in the case of $F_k \neq I$. Hereinafter, the hyper $H_\infty$ filter to realize the state estimation algorithm which is numerically stable will be indicted.

(Theorem 2)

$$\hat{x}_{k|k} = \hat{x}_{k-1|k-1} + K_{s,k}(y_k - H_k \hat{x}_{k-1|k-1}) \quad (20)$$

$$K_{s,k} = K_k(:,1)/R_{e,k}(1,1), \; K_k = \rho^{\frac{1}{2}}\left(\rho^{-\frac{1}{2}} K_k R_{e,k}^{-\frac{1}{2}} J_1^{-1}\right) J_1 R_{e,k}^{\frac{1}{2}} \quad (21)$$

$$\begin{bmatrix} R_k^{\frac{1}{2}} & C_k \hat{\Sigma}_{k|k-1}^{\frac{1}{2}} \\ 0 & \rho^{-\frac{1}{2}} \hat{\Sigma}_{k|k-1}^{\frac{1}{2}} \end{bmatrix} \Theta(k) = \begin{bmatrix} R_{e,k}^{\frac{1}{2}} & 0 \\ \rho^{-\frac{1}{2}} K_k R_{e,k}^{-\frac{1}{2}} J_1^{-1} & \hat{\Sigma}_{k+1|k}^{\frac{1}{2}} \end{bmatrix} \quad (22)$$

Where, $$R_k = R_k^{\frac{1}{2}} J_1 R_k^{\frac{T}{2}}, \quad (23)$$

$$R_k^{\frac{1}{2}} = \begin{bmatrix} \rho^{\frac{1}{2}} & 0 \\ 0 & \rho^{\frac{1}{2}} \gamma_f \end{bmatrix},$$

$$J_1 = \begin{bmatrix} 1 & 0 \\ 0 & -1 \end{bmatrix},$$

$$\hat{\Sigma}_{k|k-1} = \hat{\Sigma}_{k|k-1}^{\frac{1}{2}} \hat{\Sigma}_{k|k-1}^{\frac{T}{2}}$$

$$R_{e,k} = R_k + C_k \hat{\Sigma}_{k|k-1} C_k^T,$$

$$C_k = \begin{bmatrix} H_k \\ H_k \end{bmatrix},$$

$$R_{e,k} = R_{e,k}^{\frac{1}{2}} J_1 R_{e,k}^{\frac{T}{2}}, \; \hat{x}_{0|0} = \breve{x}_0$$

$\Theta(k)$ denotes a J-unitary matrix, that is, satisfies $\Theta(k) J \Theta H(k)^T = J$, $J=(J_1 \oplus (I))$, I denotes a unit matrix, $K_k(:,1)$ denotes a column vector of a first column of the matrix $K_k$.

Incidentally, in expressions (21) and (22), $J_1^{-1}$ and $J_1$ can be deleted.

Figure 4:
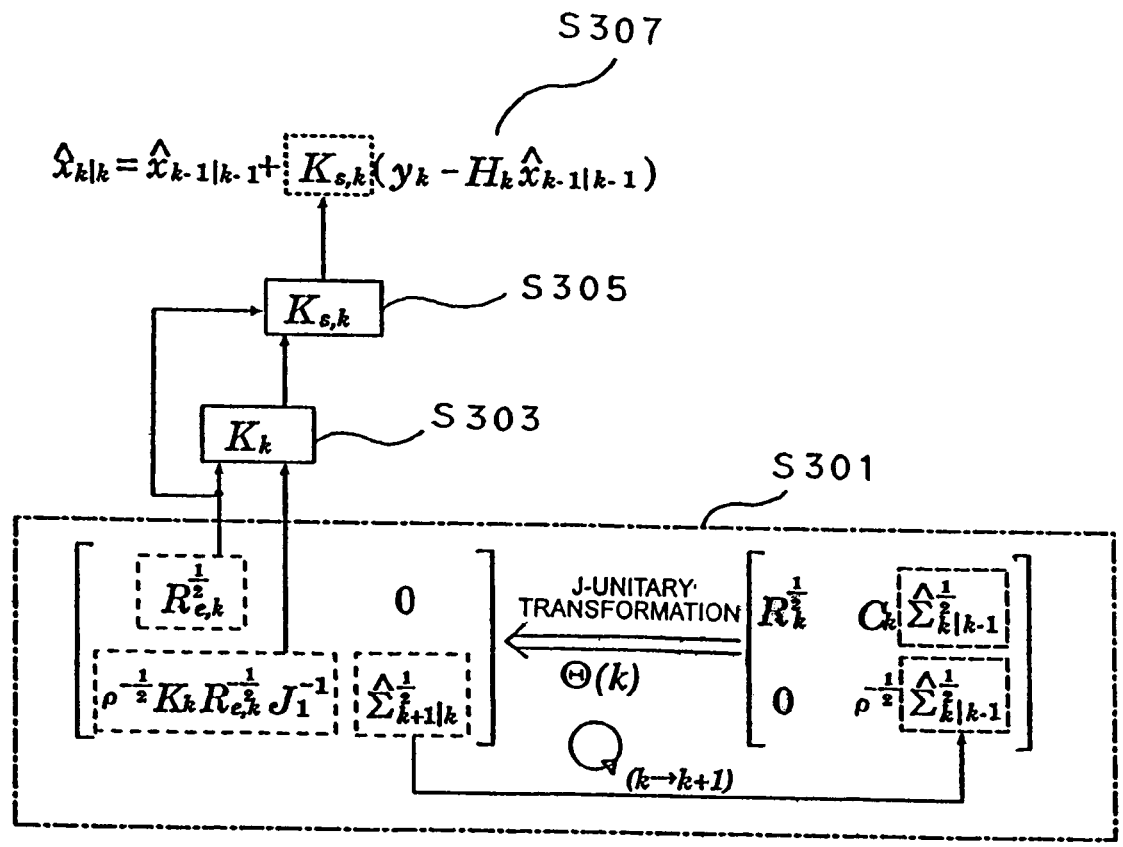
FIG. 4 is an explanatory view of a square root array algorithm of Theorem 2.

FIG. 4 is an explanatory view of the square root array algorithm of Theorem 2. This calculation algorithm can be used in the calculation (S105) of the $H_\infty$ filter in the flowchart of Theorem 1 shown in FIG. 2.

In this estimation algorithm, instead of obtaining $\hat{\Sigma}_{k|k-1}$ by a Riccati type update expression, its factor matrix $\hat{\Sigma}^{1/2}_{k|k-1} \in R^{N \times N}$ (square root matrix of $\hat{\Sigma}_{k|k-1}$) is obtained by the update expression based on the J-unitary transformation. From a 1-1 block matrix and a 2-1 block matrix generated at this time, the filter gain $K_{s,k}$ is obtained as shown in the figure. Thus, $\hat{\Sigma}_{k|k} = \hat{\Sigma}^{1/2}_{k|k-1} \hat{\Sigma}^{T/2}_{k|k-1} > 0$ is established, the positive definite property of $\hat{\Sigma}_{k|k-1}$ is ensured, and it can be numerically stabilized. Incidentally, a computational complexity of the $H_\infty$ filter of Theorem 2 per unit step remains O ($N^2$).

Incidentally, in FIG. 4, $J_1^{-1}$ can be deleted.

First, the processing section 101 reads out terms contained in the respective elements of the left-side equations of expression (22) from the storage section 105 or obtains them from the internal memory or the like, and executes the J-unitary transformation (S301). The processing section 101 calculates system gains $K_k$ and $K_{s,k}$ from the elements of the right-side equations of the obtained expression (22) based on expression $(_{21})$ (S303, S305). The processing section 101 calculates the state estimated value $\hat{x}_{k|k}$ based on expression (20) (S307).

5. Numerically Stable Fast Algorithm for State Estimation

As described above, a computational complexity of the $H_\infty$ filter of Theorem $_2$ per unit step remains $O(N^2)$. Then, as a countermeasure for the complexity, by using that when $\underline{H}_k = \underline{H}_{k+1} \Psi, \underline{H}_k = [u(k), \ldots, u(0), 0, \ldots, 0]$, a covariance matrix $\underline{\Sigma}_{k+1|k}$ of one step prediction error of $\underline{x}_k = [X^T_k, O^T]^T$ satisfies $$\underline{\Sigma}_{k+1|k} - \Psi \underline{\Sigma}_{k|k-1} \Psi^T = -\underline{L}_k R_{r,k}^{-1} \underline{L}_k^T, \; \underline{L}_k = \begin{bmatrix} \tilde{L}_k \\ 0 \end{bmatrix} \quad (24)$$

consideration is given to updating $\underline{L}_k$ (that is, $L_k$) with a low dimension instead of $\underline{\Sigma}_{k+1|k}$. Here, when attention is paid to $R_{r,k} = R^{1/2}_{r,k} S R^{T/2}_{r,k}$, next Theorem 3 can be obtained.

(Theorem 3)

$$\hat{x}_{k|k} = \hat{x}_{k-1|k-1} + K_{s,k}(y_k - H_k \hat{x}_{k-1|k-1}) \quad (61)$$

$$K_{s,k} = K_k(:,1)/R_{e,k}(1,1), \; K_k = \rho^{\frac{1}{2}}\left(\bar{K}_k R_{e,k}^{-\frac{1}{2}}\right) R_{e,k}^{\frac{1}{2}} \quad (62)$$

$$\begin{bmatrix} R_{e,k+1}^{\frac{1}{2}} & 0 \\ \begin{bmatrix} \bar{K}_{k+1} \\ 0 \end{bmatrix} R_{e,k+1}^{-\frac{T}{2}} J_1 & \tilde{L}_{k+1} R_{r,k+1}^{-\frac{T}{2}} \end{bmatrix} = \begin{bmatrix} R_{e,k}^{\frac{1}{2}} & C_{k+1} \tilde{L}_k R_{r,k}^{-\frac{1}{2}} \\ \begin{bmatrix} 0 \\ \bar{K}_k \end{bmatrix} R_{e,k}^{-\frac{1}{2}} J_1 & \rho^{-\frac{1}{2}} \tilde{L}_k R_{r,k}^{-\frac{1}{2}} \end{bmatrix} \Theta(k) \quad (63)$$

here, $\Theta(k)$ denotes an arbitrary J-unitary matrix, and $C_k = \check{c}_{k+1} \Psi$ is established, where $$R_k = R_k^{\frac{1}{2}} J_1 R_k^{\frac{T}{2}}, \quad (23)$$

$$R_k^{\frac{1}{2}} = \begin{bmatrix} \rho^{\frac{1}{2}} & 0 \\ 0 & \rho^{\frac{1}{2}} \gamma_f \end{bmatrix},$$

$$J_1 = \begin{bmatrix} 1 & 0 \\ 0 & -1 \end{bmatrix},$$

$$\hat{\Sigma}_{k|k-1} = \hat{\Sigma}_{k|k-1}^{\frac{1}{2}} \hat{\Sigma}_{k|k-1}^{\frac{T}{2}}$$

$$R_{e,k} = R_k + C_k \hat{\Sigma}_{k|k-1} C_k^T,$$

$$C_k = \begin{bmatrix} H_k \\ H_k \end{bmatrix},$$

$$R_{e,k} = R_{e,k}^{\frac{1}{2}} J_1 R_{e,k}^{\frac{T}{2}},$$

$$\hat{x}_{0|0} = \breve{x}_0$$

Incidentally, the proof of Theorem 3 will be described later.

The above expression can be arranged with respect to $K_k$ instead of $K^-_k (= P^{-1/2} K_k)$.

Further, when the following J-unitary matrix $$\Theta(k) = (J_1 R_{e,k}^{1/2} \oplus - R_{r,k}^{1/2}) \Sigma(k) (R_{e,k+1}^{-T/2} J_1^{-1} \oplus - R_{r,k+1}^{-T/2})$$

is used, a fast state estimation algorithm of Theorem 4 can be obtained. Where, $\Psi$ denotes a shift matrix.

(Theorem 4)

$$\hat{x}_{k|k} = \hat{x}_{k-1|k-1} + K_{s,k}(y_k - H_k \hat{x}_{k-1|k-1}) \quad (25)$$

$$K_{s,k} = \rho^{\frac{1}{2}} \overline{K}_k(:,1)/R_{e,k}(1,1) \quad (26)$$

$$\begin{bmatrix} \overline{K}_{k+1} \\ 0 \end{bmatrix} = \begin{bmatrix} 0 \\ \overline{K}_k \end{bmatrix} - \rho^{-\frac{1}{2}} \tilde{L}_k R_{r,k}^{-1} \tilde{L}_k^T \check{C}_{k+1}^T \quad (27)$$

$$\tilde{L}_{k+1} = \rho^{-\frac{1}{2}} \tilde{L}_k - \begin{bmatrix} 0 \\ \overline{K}_k \end{bmatrix} R_{e,k}^{-1} \check{C}_{k+1} \tilde{L}_k \quad (28)$$

$$R_{e,k+1} = R_{e,k} - \check{C}_{k+1} \tilde{L}_k R_{r,k}^{-1} \tilde{L}_k^T \check{C}_{k+1}^T \quad (29)$$

$$R_{r,k+1} = R_{r,k} - \tilde{L}_k^T \check{C}_{k+1}^T R_{e,k}^{-1} \check{C}_{k+1} \tilde{L}_k \quad (30)$$

Where, $$\check{C}_{k+1} = \begin{bmatrix} \acute{H}_{k+1} \\ \check{H}_{k+1} \end{bmatrix}, \quad (31)$$

$$\check{H}_{k+1} = [u_{k+1} u(k+1-N)] = [u(k+1) u_k],$$

$$\acute{H}_1 = [u(1), 0, \ldots, 0]$$

$$R_{e,1} = R_1 + \check{C}_1 \check{\Sigma}_{1|0} \check{C}_1^T,$$

$$R_1 = \begin{bmatrix} \rho & 0 \\ 0 & -\rho \gamma_f^2 \end{bmatrix},$$

$$\check{\Sigma}_{1|0} = \text{diag}\{\rho^2, \rho^3, \ldots, \rho^{N+2}\},$$

$$\rho = 1 - \chi(\gamma_f)$$

$$\tilde{L}_0 = \begin{bmatrix} 1 & 0 \\ 0 & 0 \\ 0 & 1 \end{bmatrix} \in \mathcal{R}^{(N+1) \times 2},$$

$$R_{r,0} = \begin{bmatrix} -1 & 0 \\ 0 & -\rho^N \end{bmatrix},$$

$$\overline{K}_0 = 0,$$

$$\hat{x}_{0|0} = \check{x}_0,$$

$$\overline{K}_k = \rho^{-\frac{1}{2}} K_k$$

diag[·] denotes a diagonal matrix, and $R_{e,k+1}(1,1)$ denotes a 1-1 element of the matrix $R_{e,k+1}$. Besides, the above expression can be arranged with respect to $K_k$ instead of $K_k^-$.

In the fast algorithm, since the filter gain $K_{s,k}$ is obtained by the update of $L_k \in R^{(N+1) \times 2}$ in the following factoring $$\Sigma_{k+1|k} - \Psi \Sigma_{k|k-1} \Psi^T = -L_k R_{r,k}^{-1} L_k^T \quad (32)$$

O(N+1) is sufficient for the amount of calculation per unit step. Here, attention should be paid to the following expression.

$$\begin{bmatrix} \overline{K}_{k+1} \\ 0 \end{bmatrix} - \begin{bmatrix} 0 \\ \overline{K}_K \end{bmatrix} = \rho^{-\frac{1}{2}} \left( \Sigma_{k+1|k} \check{C}_{k+1}^T - \Psi \Sigma_{k|k-1} \check{C}_k^T \right) \quad (60)$$

Figure 5:
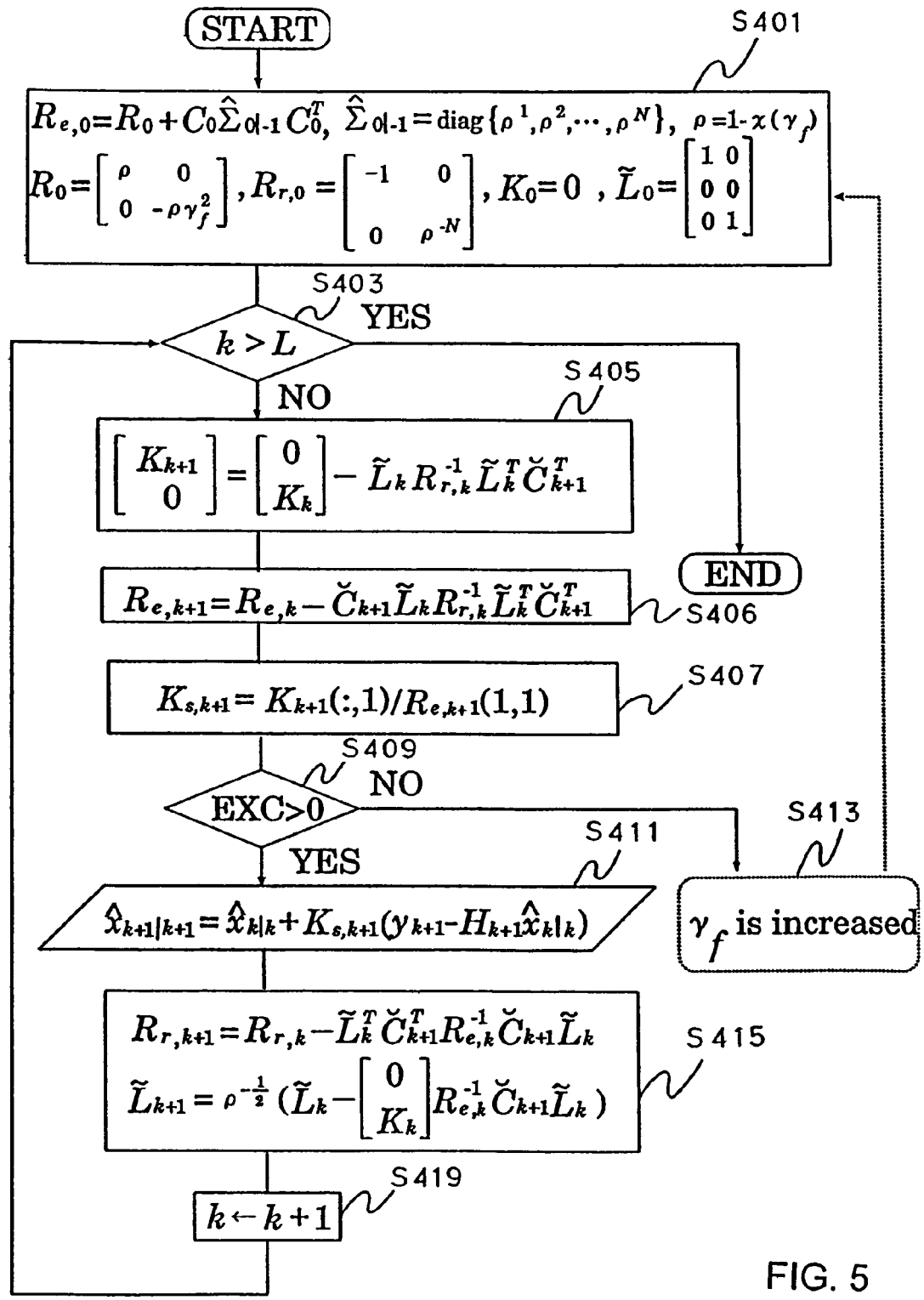
FIG. 5 is a flowchart of a fast algorithm of Theorem 3, which is numerically stable.

FIG. 5 is one example of a flowchart of a numerically stable fast algorithm of Theorem 4. The fast algorithm is incorporated in the calculation step (S105) of the H∞ filter of FIG. 2, and is optimized by the γ-iteration. Thus, during a period in which the existence condition is satisfied, $\gamma_f$ is gradually decreased, however, at the time point when it comes to be unsatisfied, $\gamma_i$ is increased as indicated in the figure.

The H∞ filtering algorithm can be summarized as follows.

[Step S401] The processing section 101 determines an initial condition of the recursive expression as indicated in the figure. Incidentally, L denotes a maximum data number.

[Step S403] The processing section 101 compares the time k with the maximum data number L. When the time k is larger than the maximum data number, the processing section 101 ends the processing, and when not larger, advance is made to a next step. (When unnecessary, the conditional sentence can be removed. Alternatively, restart is made.)

[Step S405] The processing section 101 recursively calculates a term $K_{k+1}$ corresponding to a filter gain by using expressions (27) and (31).

[Step S406] The processing section 101 recursively calculates $R_{e,k+1}$ by using expression (29).

[Step S407] The processing section 101 further calculates $K_{s,k}$ by using expressions (26) and (31).

[Step S409] The processing section 101 judges the existence condition EXC>0 here, and when the existence condition is satisfied, advance is made to step S411.

[Step S413] On the other hand, when the existence condition is not satisfied at step S409, the processing section 101 increases $\gamma_f$, and return is made to step S401.

[Step S411] The processing section 101 updates the filter equation of the H∞ filter of expression (25).

[Step S415] The processing section 101 recursively calculates $R_{r,k+1}$ by using expression (30). Besides, the processing section 101 recursively calculates Lhd k+1 by using expressions (28) and (31).

[Step S419] The processing section 101 advances the time k (k=k+1), returns to step S403, and continues as long as data exists.

Incidentally, the processing section 101 may store a suitable intermediate value and a final value obtained at the respective steps, such as the H∞ filter calculation steps S405 to S415 and the calculation step S409 of the existence condition, into the storage section 105 as the need arises, and may read them from the storage section 105.

6. Echo Canceller

Next, a mathematical model of an echo canceling problem is generated.

First, when consideration is given to the fact that a received signal $\{u_k\}$ becomes an input signal to an echo path, by a (time-varying) impulse response $\{h_i[k]\}$ of the echo path, an observed value $\{y_k\}$ of an echo $\{d_k\}$ is expressed by the following expression.

$$y_k = d_k + v_k = \sum_{i=0}^{N-1} h_i[k] u_{k-i} + v_k, \quad (33)$$

$$k = 0, 1, 2, \ldots$$

Here, $u_k$ and $y_k$ respectively denote the received signal and the echo at a time $t_k$ (=kT; T is a sampling period), $v_k$ denotes circuit noise having a mean value of 0 at the time $t_k$, $h_i[k]$, $i=0, \ldots, N-1$ denotes a time-varying impulse response, and the tap number N thereof is known. At this time, when estimated values $\{\hat{h}_i[k]\}$ of the impulse response are obtained every moment, a pseudo-echo as indicated below can be generated by using that.

$$\hat{d}_k = \sum_{i=0}^{N-1} \hat{h}_i[k] u_{k-i}, \quad (34)$$
$$k = 0, 1, 2, \ldots$$

When this is subtracted from the echo ($y_k - \hat{d}_k \approx 0$), the echo can be cancelled. Where, it is assumed that if $k-i<0$, then $u_{k-1}=0$.

From the above, the problem can be reduced to the problem of successively estimating the impulse response $\{h_i[k]\}$ of the echo path from the received signal $\{u_k\}$ and the echo $\{y_k\}$ which can be directly observed.

In general, in order to apply the $H_\infty$ filter to the echo canceller, first, expression (32) must be expressed by a state space model including a state equation and an observation equation. Then, since the problem is to estimate the impulse response $\{h_i[k]\}$, when $\{h_i[k]\}$ is made a state variable $x_k$, and a variance of about $w_k$ is allowed, the following state space model can be established for the echo path.

$$x_{k+1} = x_k + G_k w_k, \; x_k, w_k \in R^N \quad (35)$$
$$y_k = H_k x_k + v_k, \; y_k, v_k \in R \quad (36)$$
$$z_k = H_k x_k, \; z_k \in R, \; H_k \in R^{1 \times N} \quad (37)$$

Where, $$x_k = [h_0[k], \ldots, h_{N-1}[k]]^T, w_k = [w_k(1), \ldots, w_k(N)]^T$$

$$H_k = [u_k, \ldots, u_{k-N+1}]$$

The hyper and fast $H_\infty$ filtering algorithms to the state space model as stated above is as described before. Besides, at the estimation of the impulse response, when the generation of a transmission signal is detected, the estimation is generally suspended during that.

7. Evaluation to Impulse Response (Confirmation of Operation)

With respect to the case where the impulse response of the echo pulse is temporally invariable ($h_i[k]=h_i$), and the tap number N is 48, the operation of the fast algorithm is confirmed by using a simulation.

$$y_k = \sum_{i=0}^{47} h_i u_{k-i} + v_k \quad (38)$$

Incidentally, FIG. 6 is a view showing values of the impulse response $\{h_i\}$ here.

Here, the value shown in the figure are used for the impulse response $\{h_i\}_{i=0}^{23}$, and the other $\{h_i\}_{i=24}^{47}$ is made 0. Besides, it is assumed that $v_k$ is stationary Gaussian white noise having a mean value of 0 and variance $\sigma_v^2=1.0\times10^{-6}$, and the sampling period T is made 1.0 for convenience.

Besides, the received signal $\{u_k\}$ is approximated by a secondary AR model as follows.

$$u_k = \alpha_1 u_{k-1} + \alpha_2 u_{k-2} + w_k' \quad (39)$$

Where, $\alpha_1=0.7$ and $\alpha_2=0.1$ are assumed, and $w_k'$ denotes stationary Gaussian white noise having a means value of 0 and variance $\sigma_{w'}^2=0.04$.

(Estimation Result of Impulse Response)

Figure 7:
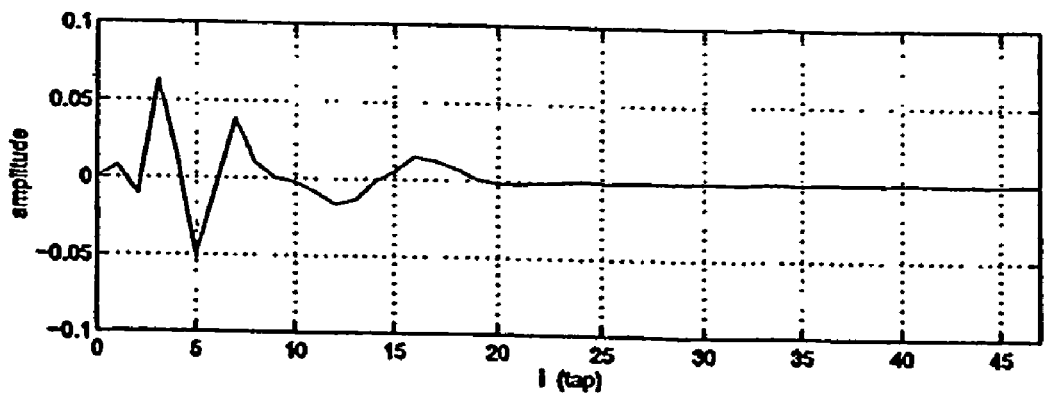
FIG. 7 shows an estimation result of the impulse response by the fast algorithm of Theorem 3, which is numerically stable.
Figure 7:
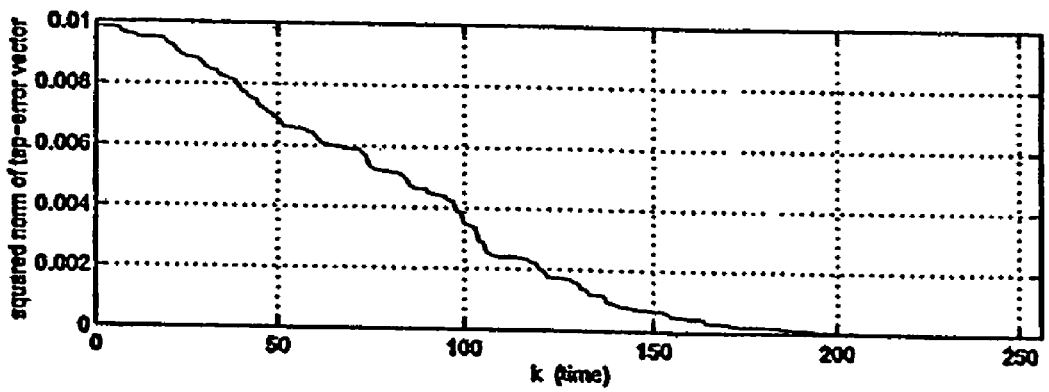
Figure 8:
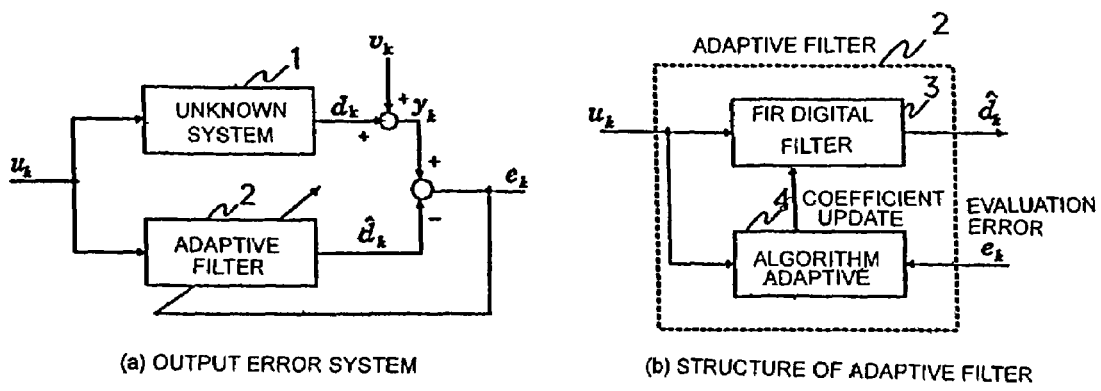
FIG. 8 is a structural view for system estimation.
Figure 9:
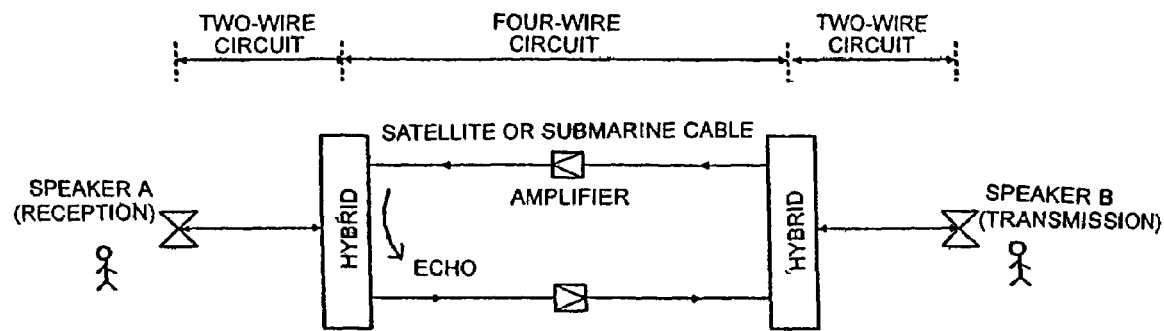
FIG. 9 is an explanatory view of a communication system and an echo.
Figure 10:
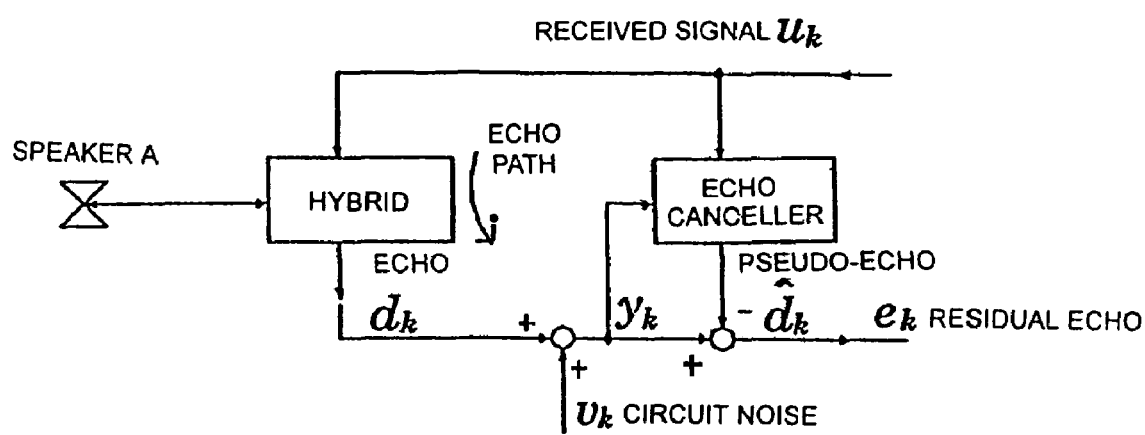
FIG. 10 is a principle view of an echo canceller.

FIG. 7 shows an estimation result of the impulse response by the numerically stable fast algorithm of Theorem 4. Here, the vertical axis of FIG. 7(b) indicates $$\sqrt{\{\Sigma_{i=0}^{47}(h_i - \hat{x}_k(i+1))^2\}}.$$

By this, it is understood that the estimation can be excellently performed by the fast algorithm. Where, $\rho=1-\chi(\gamma_f)$, $\chi(\gamma_f)=\gamma_f^{-2}$, $\hat{x}_{0|0}=0$ and $\hat{\Sigma}_{0|0}=20I$ were assumed, and the calculation was performed at double precision. Besides, while the existence condition is confirmed, $\gamma_f=5.5$ was set.

8. Proof of Theorem 8-1. Proof of Theorem 2

When the following expression:

$$\begin{bmatrix} R_k^{\frac{1}{2}} & C_k \hat{\Sigma}_{k|k-1}^{\frac{1}{2}} \\ 0 & \rho^{-\frac{1}{2}} \hat{\Sigma}_{k|k-1}^{\frac{1}{2}} \end{bmatrix} J \begin{bmatrix} R_k^{\frac{T}{2}} & 0 \\ \hat{\Sigma}_{k|k-1}^{\frac{1}{2}} C_k^T & \rho^{-\frac{1}{2}} \hat{\Sigma}_{k|k-1}^{\frac{T}{2}} \end{bmatrix} = \quad (40)$$

$$\begin{bmatrix} R_{e,k}^{\frac{1}{2}} & 0 \\ \rho^{-\frac{1}{2}} K_k R_{e,k}^{-\frac{1}{2}} J_1^{-1} & \hat{\Sigma}_{k+1|k}^{\frac{1}{2}} \end{bmatrix} J \begin{bmatrix} R_{e,k}^{\frac{T}{2}} & \rho^{-\frac{1}{2}} J_1^{-1} R_{e,k}^{-\frac{T}{2}} K_k^T \\ 0 & \hat{\Sigma}_{k+1|k}^{\frac{T}{2}} \end{bmatrix}$$

is established, following expressions are obtained by comparing the respective terms of 2×2 block matrixes of both sides.

$$R_{e,k} = R_k + C_k \hat{\Sigma}_{k|k-1} C_k^T \quad (41)$$

$$K_k = \hat{\Sigma}_{k|k-1} C_k^T \quad (42)$$

$$\hat{\Sigma}_{k+1|k} + \rho^{-1} K_k R_{e,k}^{-1} K_k^T = \rho^{-1} \hat{\Sigma}_{k|k-1} \quad (43)$$

This is coincident with the Riccati equation of expression (13) at $F_k=I$ of Theorem 1. Where, $$J = (J_1 \oplus I), \quad (44)$$

$$J_1 = \begin{bmatrix} 1 & 0 \\ 0 & -1 \end{bmatrix},$$

$$C_k = \begin{bmatrix} H_k \\ H_k \end{bmatrix}$$

On the other hand, when $AJA^T = BJB^T$ is established, B can be expressed as $B = A\Theta(k)$ by using the J-unitary matrix $\Theta(K)$. Thus, from expression (40), the Riccati equation of Theorem 1 is equivalent to the following expression.

$$\begin{bmatrix} R_{e,k}^{\frac{1}{2}} & 0 \\ \rho^{-\frac{1}{2}} K_k R_{e,k}^{-\frac{1}{2}} J_1^{-1} & \hat{\Sigma}_{k+1|k}^{\frac{1}{2}} \end{bmatrix} = \begin{bmatrix} R_k^{\frac{1}{2}} & C_k \hat{\Sigma}_{k|k-1}^{\frac{1}{2}} \\ 0 & \rho^{-\frac{1}{2}} \hat{\Sigma}_{k|k-1}^{\frac{1}{2}} \end{bmatrix} \Theta(k) \quad (45)$$

Incidentally, in expressions (40) and (45), $J_1^{-1}$ can be deleted.

8-2. Proof of Theorem 3

It is assumed that there is a J-unitary matrix $\Theta(k)$ which performs block triangulation as follows.

$$\begin{bmatrix} X & 0 \\ Y & Z \end{bmatrix} = \begin{bmatrix} R_{e,k}^{\frac{1}{2}} & \breve{C}_{k+1} \tilde{L}_k R_{r,k}^{-\frac{1}{2}} \\ \begin{bmatrix} 0 \\ \overline{K}_k \end{bmatrix} R_{e,k}^{-\frac{1}{2}} J_1 & \rho^{-\frac{1}{2}} \tilde{L}_k R_{r,k}^{-\frac{1}{2}} \end{bmatrix} \Theta(k).$$

At this time, when both sides $J=(J_1 \oplus -S)$-norm of the above expression are compared, X, Y and Z of the left side can be determined as follows. Where, S denote a diagonal matrix in which diagonal elements take 1 or −1.

(1,1)-Block matrix $$\begin{aligned} XJ_1X^T &= R_{e,k} - \breve{C}_{k+1} \tilde{L}_k R_{r,k}^{-1} \tilde{L}_k^T \breve{C}_{k+1}^T \\ &= R_{e,k} + \breve{C}_{k+1} \left( \breve{\Sigma}_{k+1|k} - \Psi \breve{\Sigma}_{k|k-1} \Psi^T \right) \breve{C}_{k+1}^T \\ &= R_{e,k} + \breve{C}_{k+1} \breve{\Sigma}_{k+1|k} \breve{C}_{k+1}^T - \breve{C}_k \breve{\Sigma}_{k|k-1} \breve{C}_k^T \\ &= R_{e,k} + (R_{e,k+1} - R_{k+1}) - (R_{e,k} - R_k) = R_{e,k+1} \end{aligned}$$

Thus, $X=R_{e,k+1}^{1/2}$ is obtained from $R_{e,k+1}=R_{e,k+1}^{1/2} J_1 R_{e,k+1}^{T/2}, R_{k+1}=R_k$ Here, attention should be paid to the fact that $$J_1^{-1}=J_1(J_1^2=I), S^{-1}=S, R_{e,k}^T=R_{e,k+1}, R_{r,k}^T= R_{r,k}, R_{r,k}^{-1}=R_{r,k}^{-T/2} S R_{r,k}^{-1/2}, \breve{C}_k=\hat{C}_{k+1}\Psi$$
$$(\hat{C}_k^T = \Psi^T \hat{C}_{k+1}^T)$$

is established.

(2,1)-Block matrix $$\begin{aligned} YJ_1X^T &= \begin{bmatrix} 0 \\ \overline{K}_k \end{bmatrix} - \rho^{-\frac{1}{2}} \tilde{L}_k R_{r,k}^{-1} \tilde{L}_k^T \breve{C}_{k+1}^T \\ &= \begin{bmatrix} 0 \\ \overline{K}_k \end{bmatrix} + \rho^{-\frac{1}{2}} \left( \breve{\Sigma}_{k+1|k} - \Psi \breve{\Sigma}_{k|k-1} \Psi^T \right) \breve{C}_{k+1}^T \\ &= \begin{bmatrix} 0 \\ \overline{K}_k \end{bmatrix} + \rho^{-\frac{1}{2}} \left( \breve{\Sigma}_{k+1|k} \breve{C}_{k+1}^T - \Psi \breve{\Sigma}_{k|k-1} \breve{C}_k^T \right) \\ &= \begin{bmatrix} 0 \\ \overline{K}_k \end{bmatrix} + \begin{bmatrix} \overline{K}_{k+1} \\ 0 \end{bmatrix} - \begin{bmatrix} 0 \\ \overline{K}_k \end{bmatrix} \\ &= \begin{bmatrix} \overline{K}_{k+1} \\ 0 \end{bmatrix} \end{aligned}$$

By this, $$Y = \begin{bmatrix} \overline{K}_{k+1} \\ 0 \end{bmatrix} R_{e,k+1}^{-\frac{T}{2}} J_1$$

is obtained.

Where, $$\breve{C}_k^T = \left( \breve{C}_{k+1} \Psi \right)^T$$

(2,2)-Block Matrix $$\begin{aligned} -ZSZ^T + YJ_1Y^T &= \begin{bmatrix} 0 \\ \overline{K}_k \end{bmatrix} R_{e,k}^{-1} \begin{bmatrix} 0 \\ \overline{K}_k \end{bmatrix}^T - \rho^{-1} \tilde{L}_k R_{r,k}^{-1} \tilde{L}_k^T \\ &= \begin{bmatrix} 0 \\ \overline{K}_k \end{bmatrix} R_{e,k}^{-1} \begin{bmatrix} 0 \\ \overline{K}_k \end{bmatrix}^T + \rho^{-1} \left( \breve{\Sigma}_{k+1|k} - \Psi \breve{\Sigma}_{k|k-1} \Psi^T \right) \\ &= \rho^{-1} \Psi \left( \begin{bmatrix} K_k \\ 0 \end{bmatrix} R_{e,k}^{-1} \begin{bmatrix} K_k \\ 0 \end{bmatrix}^T - \breve{\Sigma}_{k|k-1} \right) \Psi^T + \rho^{-1} \breve{\Sigma}_{k+1|k} \\ &= -\Psi \breve{\Sigma}_{k+1|k} \Psi^T + \breve{\Sigma}_{k+2|k+1} + \begin{bmatrix} \overline{K}_{k+1} \\ 0 \end{bmatrix} R_{e,k+1}^{-1} \begin{bmatrix} \overline{K}_{k+1} \\ 0 \end{bmatrix}^T \end{aligned}$$

By this, $$-ZSZ^T = \breve{\Sigma}_{k+2|k+1} - \Psi \breve{\Sigma}_{k+1|k} \Psi^T = -\breve{L}_{k+1} R_{r,k+1}^{-T/2} S R_{r,k+1}^{-1/2} \breve{L}_{k+1}^T$$

and $Z=\breve{L}_{k+1} R_{r,k+1}^{-T/2}$ is obtained.

8-3. Proof of Theorem 4

When an observation matrix $H_k$ has a shift characteristic and $$J=(J_1 \oplus -S),$$

the following relational expression is obtained by a similar method to Theorem 2.

$$\begin{bmatrix} R_{e,k+1} & 0 \\ \begin{bmatrix} \overline{K}_{k+1} \\ 0 \end{bmatrix} & \tilde{L}_{k+1} \end{bmatrix} = \begin{bmatrix} R_{e,k} & \breve{C}_{k+1} \tilde{L} \\ \begin{bmatrix} 0 \\ \overline{K}_k \end{bmatrix} & \rho^{-\frac{1}{2}} \tilde{L}_k \end{bmatrix} \Sigma(k) \quad (46)$$

Where, $$\Theta(k) = \left( J_1 R_{e,k}^{\frac{1}{2}} \oplus -R_{r,k}^{\frac{1}{2}} \right) \sum(k) \left( R_{e,k+1}^{-\frac{T}{2}} J_1^{-1} \oplus -R_{r,k+1}^{-\frac{T}{2}} \right)$$

$$\Sigma(k) = \begin{bmatrix} I & -R_{e,k}^{-1} \breve{C}_{k+1} \tilde{L}_k \\ -R_{r,k}^{-1} \tilde{L}_k^T \breve{C}_{k+1}^T & I \end{bmatrix} \quad (47)$$

Where, $$\Sigma(k)^T (R_{e,k} \oplus -R_{r,k}) \Sigma(k) = (R_{e,k+1} \oplus -R_{r,k+1})$$

and $R_{r,k+1}$ is determined so that $\Sigma(k)^t(R_{e,k} \oplus -R_{r,k})\Sigma(k)=(R_{e,k+1} \oplus -R_{r,k+1})$ is established. Next, when an update expression of $R_{r,k+1}$ is newly added to the third line of expression (46), the following expression is finally obtained.

$$\begin{bmatrix} R_{e,k+1} & 0 \\ \begin{bmatrix} \bar{K}_{k+1} \\ 0 \end{bmatrix} & \tilde{L}_{k+1} \\ 0 & R_{r,k+1} \end{bmatrix} = \begin{bmatrix} R_{e,k} & \check{C}_{k+1}\tilde{L}_k \\ \begin{bmatrix} 0 \\ \bar{K}_k \end{bmatrix} & \rho^{-\frac{1}{2}}\tilde{L}_k \\ \tilde{L}_k^T \check{C}_{k+1}^T & R_{r,k} \end{bmatrix} \begin{bmatrix} I & -R_{e,k}^{-1}\check{C}_{k+1}\tilde{L}_k \\ -R_{r,k}^{-1}\tilde{L}_k^T\check{C}_{k+1}^T & I \end{bmatrix} \quad (48)$$

$$\text{Where,} = \begin{bmatrix} R_{e,k} - \check{C}_{k+1}\tilde{L}_k R_{r,k}^{-1}\tilde{L}_k^T\check{C}_{k+1}^T & 0 \\ \begin{bmatrix} 0 \\ \bar{K}_k \end{bmatrix} - \rho^{-\frac{1}{2}}\tilde{L}_k R_{r,k}^{-1}\tilde{L}_k^T\check{C}_{k+1}^T & \rho^{-\frac{1}{2}}\tilde{L}_k - \begin{bmatrix} 0 \\ \bar{K}_k \end{bmatrix} R_{e,k}^{-1}\check{C}_{k+1}\tilde{L}_k \\ 0 & R_{r,k} - \tilde{L}_k^T\check{C}_{k+1}^T R_{e,k}^{-1}\check{C}_{k+1}\tilde{L}_k \end{bmatrix}$$

From the correspondence of the respective terms of 3×2 block matrixes of both sides, the following update expression of a gain matrix $K^-_k$ is obtained.

$$\begin{bmatrix} \bar{K}_{k+1} \\ 0 \end{bmatrix} = \begin{bmatrix} 0 \\ \bar{K}_k \end{bmatrix} - \rho^{-\frac{1}{2}}\tilde{L}_k R_{r,k}^{-1}\tilde{L}_k^T\check{C}_{k+1}^T \quad (49)$$

$$\tilde{L}_{k+1} = \rho^{-\frac{1}{2}}\tilde{L}_k - \begin{bmatrix} 0 \\ \bar{K}_k \end{bmatrix} R_{e,k}^{-1}\check{C}_{k+1}\tilde{L}_k \quad (50)$$

$$R_{e,k+1} = R_{e,k} - \check{C}_{k+1}\tilde{L}_k R_{r,k}^{-1}\tilde{L}_k^T\check{C}_{k+1}^T \quad (51)$$

$$R_{r,k+1} = R_{r,k} - \tilde{L}_k^T\check{C}_{k+1}^T R_{e,k}^{-1}\check{C}_{k+1}\tilde{L}_k \quad (52)$$

INDUSTIRAL APPLICABILITY

In general, in a normal civil communication equipment or the like, calculation is often performed at single precision in view of the cost and speed. Thus, as the practical state estimation algorithm, the present invention would have effects in various industrial fields. Besides, the invention can be applied to an echo canceller in a communication system or a sound system, sound field reproduction, noise control and the like.

Although embodiments of the invention have been shown and described, it is to be understood that various modifications and substitutions, as well as rearrangements of method steps and equipment, parts and components, can be made by those skilled in the art without departing from the novel spirit and scope of the invention

The invention claimed is:

1. A system estimation method, for a communication system or a sound system or sound field reproduction or noise control, for making state estimation robust and optimizing a forgetting factor ρ simultaneously in an estimation algorithm, in which for a state space model expressed by following expressions:

$$x_{k+1} = F_k x_k + G_k w_k$$

$$y_k = H_k x_k + v_k$$

$$z_k = H_k x_k$$

here, $x_k$: a state vector or simply a state, $w_k$: a system noise, $v_k$: an observation noise, $y_k$: an observation signal, $z_k$: an output signal, $F_k$: dynamics of a system, and $G_k$: a drive matrix, as an evaluation criterion, a maximum value of an energy gain which indicates a ratio of a filter error to a disturbance including the system noise $w_k$ and the observation noise $v_k$ and is weighted with the forgetting factor ρ is suppressed to be smaller than a term corresponding to a previously given upper limit value $\gamma_f$, and the system estimation method comprises:

a step at which a processing section inputs the upper limit value $\gamma_f$, the observation signal $y_k$ as an input of a filter and a value including an observation matrix $H_k$ from a storage section or an input section;

a step at which the processing section determines the forgetting factor ρ; as a following function of $\gamma_f$;

$$\rho = 1 - \chi(\gamma_f)$$

where $\chi(\gamma_f)$ denotes a monotonicaly damping function of $\gamma_f$ to satisfy $\chi(1)=1$ and $\chi(\infty)=0$,;

a step of executing a hyper $H_\infty$ filter at which the processing section reads out an initial value or a value including the observation matrix $H_k$ at a time from the storage section and obtains a filter gain $K_{s,k}$ by using the forgetting factor ρ and a gain matrix $K_k$ and by following expressions (20) to (22):

$$\hat{x}_{k|k} = \hat{x}_{k-1|k-1} + K_{s,k}(y_k - H_k\hat{x}_{k-1|k-1}) \quad (20)$$

$$K_{s,k} = K_k(:,1)/R_{e,k}(1,1), \quad K_k = \rho^{\frac{1}{2}}\left(\rho^{-\frac{1}{2}}K_k R_{e,k}^{-\frac{1}{2}}J_1^{-1}\right)J_1 R_{e,k}^{\frac{1}{2}} \quad (21)$$

$$\begin{bmatrix} R_k^{\frac{1}{2}} & C_k\hat{\Sigma}_{k|k-1}^{\frac{1}{2}} \\ 0 & \rho^{-\frac{1}{2}}\hat{\Sigma}_{k|k-1}^{\frac{1}{2}} \end{bmatrix} \Theta(k) = \begin{bmatrix} R_{e,k}^{\frac{1}{2}} & 0 \\ \rho^{-\frac{1}{2}}K_k R_{e,k}^{-\frac{1}{2}}J_1^{-1} & \hat{\Sigma}_{k+1|k}^{\frac{1}{2}} \end{bmatrix} \quad (22)$$

Where,

-continued $$R_k = R_k^{\frac{1}{2}} J_1 R_k^{\frac{T}{2}}, \quad (23)$$

$$R_k^{\frac{1}{2}} = \begin{bmatrix} \rho^{\frac{1}{2}} & 0 \\ 0 & \rho^{\frac{1}{2}} \gamma_f \end{bmatrix},$$

$$J_1 = \begin{bmatrix} 1 & 0 \\ 0 & -1 \end{bmatrix},$$

$$\hat{\Sigma}_{k|k-1} = \hat{\Sigma}_{k|k-1}^{\frac{1}{2}} \hat{\Sigma}_{k|k-1}^{\frac{T}{2}}$$

$$R_{e,k} = R_k + C_k \hat{\Sigma}_{k|k-1} C_k^T,$$

$$C_k = \begin{bmatrix} H_k \\ H_k \end{bmatrix},$$

$$R_{e,k} = R_{e,k}^{\frac{1}{2}} J_1 R_{e,k}^{\frac{T}{2}},$$

$$\hat{x}_{0|0} = \breve{x}_0$$

$\Theta(k)$ denotes a J-unitary matrix, that is, satisfies
$\Theta(k) J \Theta H(k)^T = J$, $J = (J_1 \oplus I)$, I denotes a unit matrix, $K_k(:,1)$ denotes a column vector of a first column of the matrix $K_k$ $$R_k = \begin{bmatrix} \rho & 0 \\ 0 & -\rho \gamma_f^2 \end{bmatrix}$$

here,
$\hat{x}_{k|k}$: the estimated value of the state $x_k$ at the time k using the observation signals $y_0$ to $y_k$,
$y_k$: the observation signal,
$F_k$: the dynamics of the system, $F_k = I$ for simplification,
$K_{s,k}$: the filter gain,
$H_k$: the observation matrix,
$\hat{\Sigma}_{k|k}$: corresponding to a covariance matrix of an error of $\hat{x}_{k|k}$,
$\Theta(k)$: the J-unitary matrix, and
$R_{e,k}$: an auxiliary variable,
a step at which the processing section stores an estimated value of the state $x_k$ by the hyper $H_\infty$ filter into the storage section;
a step at which the processing section calculates an existence condition based on the upper limit value $\gamma_f$ and the forgetting factor $\rho$ by the obtained observation matrix $H_i$ or the observation matrix $H_i$ and the filter gain $K_{s,i}$, and
a step at which the processing section decreases the upper limit value $\gamma_f$ by a factor of $\Delta\gamma$ and stores the resultant value into the storage section while the existence condition is satisfied in the step of executing the hyper $H_\infty$ filter,
wherein the $H_\infty$ filter equation is applied to obtain the state estimated value $\hat{x}_{k|K} = [\hat{h}_1[k], \ldots, \hat{h}_N[k]]^T$, where $\hat{h}[k]$ is the estimated value of impulse response,
a pseudo-echo is estimated by a following expression:

$$\hat{d}_k = \sum_{i=0}^{N-1} \hat{h}_i[k] u_{(k-i)}, \quad (34)$$

$$k = 0, 1, 2, \ldots$$

and an actual echo is cancelled by the obtained pseudo-echo.

2. The system estimation method according to claim 1, wherein the processing section calculates the existence condition in accordance with a following expression:

$$\hat{\Sigma}_{i|i}^{-1} = \Sigma_{i|i-1}^{-1} + \frac{1 - \gamma_f^{-2}}{\rho} H_i^T H_i > 0, \quad (17)$$

$$i = 0, \ldots, k.$$

3. The system estimation method according to claim 1, wherein the processing section calculates the existence condition in accordance with a following expression:

$$-\varrho \hat{\Xi}_i + \rho \gamma_f^2 > 0, \quad i = 0, \ldots, k \quad (18)$$

here, $$\varrho = 1 - \gamma_f^2, \quad (19)$$

$$\hat{\Xi}_i = \frac{\rho H_i K_{s,i}}{1 - H_i K_{s,i}},$$

$$\rho = 1 - \chi(\gamma_f)$$

where the forgetting factor $\rho$ and the upper limit value $\gamma_f$ have a following relation:
$0 < \rho = 1 - \chi(\gamma_f) \leq 1$, where $\chi(\gamma_f)$ denotes a monotonically damping function of $\gamma_f$ to satisfy $\chi(1) = 1$ and $\chi(\infty) = 0$.

4. The system estimation method according to claim 1, wherein the step of executing the hyper $H_\infty$ filter includes:
a step at which the processing section calculates $\hat{\Sigma}_{k+1|k}^{1/2}$ by using the expression (22);
a step at which the processing section calculates the filter gain $K_{s,k}$ based on an initial condition of $\hat{\Sigma}_{k|k-1}$ and an initial condition of $C_k$, by using the expression (21);
a step at which the processing section updates a filter equation of the $H_\infty$ filter of the expression (20); and
a step at which the processing section repeatedly executes the step of calculating by using the expression (20), the step of calculating by using the expression (21) and, the step of updating while advancing the time k.

5. A system estimation method, for a communication system or a sound system or sound field reproduction or noise control, for making state estimation robust and optimizing a forgetting factor $\rho$ simultaneously in an estimation algorithm, in which
for a state space model expressed by following expressions:

$$x_{k+1} = F_k x_k + G_k w_k$$

$$y_k = H_k x_k + v_k$$

$$z_k = H_k x_k$$

here,
$x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix,
as an evaluation criterion, a maximum value of an energy gain which indicates a ratio of a filter error to a disturbance including the system noise $w_k$ and the observation noise $v_k$ and is weighted with the forgetting factor $\rho$ is suppressed to be smaller than a term corresponding to a previously given upper limit value $\gamma_f$, and the system estimation method comprises:

a step at which a processing section inputs the upper limit value $\gamma_f$, the observation signal $y_k$ as an input of a filter and a value including an observation matrix $H_k$ from a storage section or an input section;

a step at which the processing section determines the forgetting factor $\rho$ relevant to the state space model in accordance with the upper limit value $\gamma_f$, as a following function of $\gamma_f$, $$\rho = 1 - \chi(\gamma_f)$$

where $\chi(\gamma_f)$ denotes a monotonicaly damping function of $\gamma_f$ to satisfy $\chi(1)=1$ and $\chi(\infty)=0$, a step of executing a hyper $H_\infty$ filter at which the processing section reads out an initial value or a value including the observation matrix $H_k$ at a time from the storage section and obtains a filter gain $K_{s,k}$ by using the forgetting factor $\rho$ and a gain matrix $K_k$ and by following expressions:

$$\hat{x}_{k|k} = \hat{x}_{k-1|k-1} + K_{s,k}(y_k - H_k \hat{x}_{k-1|k-1}) \quad (61)$$

$$K_{s,k} = K_k(:,1)/R_{e,k}(1,1), \quad K_k = \rho^{\frac{1}{2}} \left( \bar{K}_k R_{e,k}^{-\frac{1}{2}} \right) R_{e,k}^{\frac{1}{2}} \quad (62)$$

$$\begin{bmatrix} R_{e,k+1}^{\frac{1}{2}} & 0 \\ \begin{bmatrix} \bar{K}_{k+1} \\ 0 \end{bmatrix} R_{e,k+1}^{-\frac{T}{2}} J_1 & \tilde{L}_{k+1} R_{r,k+1}^{-\frac{T}{2}} \end{bmatrix} = \begin{bmatrix} R_{e,k}^{\frac{1}{2}} & C_{k+1} \tilde{L}_k R_{r,k}^{-\frac{1}{2}} \\ \begin{bmatrix} 0 \\ \bar{K}_k \end{bmatrix} R_{e,k}^{-\frac{1}{2}} J_1 & \rho^{-\frac{1}{2}} \tilde{L}_k R_{r,k}^{-\frac{1}{2}} \end{bmatrix} \Theta(k) \quad (63)$$

here, $\Theta(k)$ denotes an arbitrary J-unitary matrix, and $C_k = C_{k+1} \Psi$ is established, where $$R_k = R_k^{\frac{1}{2}} J_1 R_k^{\frac{T}{2}}, \quad (23)$$

$$R_k^{\frac{1}{2}} = \begin{bmatrix} \rho^{\frac{1}{2}} & 0 \\ 0 & \rho^{\frac{1}{2}} \gamma_f \end{bmatrix},$$

$$J_1 = \begin{bmatrix} 1 & 0 \\ 0 & -1 \end{bmatrix},$$

$$\hat{\Sigma}_{k|k-1} = \hat{\Sigma}_{k|k-1}^{\frac{1}{2}} \hat{\Sigma}_{k|k-1}^{\frac{T}{2}}$$

$$R_{e,k} = R_k + C_k \hat{\Sigma}_{k|k-1} C_k^T,$$

$$C_k = \begin{bmatrix} H_k \\ H_k \end{bmatrix},$$

$$R_{e,k} = R_{e,k}^{\frac{1}{2}} J_1 R_{e,k}^{\frac{T}{2}},$$

$$\hat{x}_{0|0} = \check{x}_0$$

$$R_k = \begin{bmatrix} \rho & 0 \\ 0 & -\rho \gamma_f^2 \end{bmatrix}$$

here, $\hat{x}_{k|k}$: the estimated value of the state $x_k$ at the time k using the observation signals $y_0$ to $y_k$, $y_k$: the observation signal, $K_{s,k}$: the filter gain, $H_k$: the observation matrix, $\Theta(k)$: the J-unitary matrix, and $R_{e,k}$: an auxiliary variable, a step at which the processing section stores an estimated value of the state $x_k$ by the hyper $H_\infty$ filter into the storage section;

a step at which the processing section calculates an existence condition based on the upper limit value $\gamma_f$ and the forgetting factor $\rho$ by the obtained observation matrix $H_i$ or the observation matrix $H_i$ and the filter gain $K_{s,i}$, and a step at which the processing section decreases the upper limit value $\gamma_f$ by a factor of $\Delta\gamma$ and stores the resultant value into the storage section while the existence condition is satisfied in the step of executing the hyper $H_\infty$ filter, wherein the $H_\infty$ filter equation is applied to obtain the state estimated value $\hat{x}_{k|K} = [\hat{h}_1[k], \ldots, \hat{h}_N[k]]^T$, where $\hat{h}[k]$ is the estimated value of impulse response, a pseudo-echo is estimated by a following expression:

$$\hat{d}_k = \sum_{i=0}^{N-1} \hat{h}_i[k] u_{(k-i)}, \quad k = 0, 1, 2, \ldots \quad (34)$$

and an actual echo is cancelled by the obtained pseudo-echo.

6. The system estimation method according to claim 5, wherein the step of executing the hyper $H_\infty$ filter includes:

a step at which the processing section calculates $K^-_k$ based on an initial condition of $R_{e,k+1}$, $R_{r,k+1}$ and $L_{k+1}$ by using the expression (63);

a step at which the processing section calculates the filter gain $K_{s,k}$ based on the initial condition and by using the expression (62);

a step at which the processing section updates a filter equation of the $H_\infty$ filter of the expression (61); and a step at which the processing section repeatedly executes the step of calculating by using the expression (63), the step of calculating by using the expression (62), and, the step of updating while advancing the time k.

7. A system estimation method, for a communication system or a sound system or sound field reproduction or noise control, for making state estimation robust and optimizing a forgetting factor $\rho$ simultaneously in an estimation algorithm, in which for a state space model expressed by following expressions:

$$x_{k+1} = F_k x_k + G_k w_k$$

$$y_k = H_k x_k + v_k$$

$$z_k = H_k x_k$$

here, $x_k$: a state vector or simply a state, $w_k$: a system noise, $v_k$: an observation noise, $y_k$: an observation signal, $z_k$: an output signal, $F_k$: dynamics of a system, and $G_k$: a drive matrix, as an evaluation criterion, a maximum value of an energy gain which indicates a ratio of a filter error to a disturbance including the system noise $w_k$ and the observation noise $v_k$ and is weighted with the forgetting factor $\rho$ is suppressed to be smaller than a term corresponding to a previously given upper limit value $\gamma_f$, and the system estimation method comprises:
a step at which a processing section inputs the upper limit value $\gamma_f$, the observation signal $y_k$ as an input of a filter and a value including an observation matrix $H_k$ from a storage section or an input section;
a step at which the processing section determines the forgetting factor $\rho$ as a following function $\gamma_f$, $$\rho=1-\chi(\gamma_f)$$

where $\chi(\gamma_f)$ denotes a monotonicaly damping function of $\gamma_f$ to satisfy $\chi(1)=1$ and $\chi(\infty)=0$,
a step of executing a hyper $H_\infty$ filter at which the processing section reads out an initial value or a value including the observation matrix $H_k$ at a time from the storage section and obtains a filter gain $K_{s,k}$ by using the forgetting factor $\rho$ and a gain matrix $\bar{K}_k$ and by following expressions:

$$\hat{x}_{k|k} = \hat{x}_{k-1|k-1} + K_{s,k}(y_k - H_k\hat{x}_{k-1|k-1}) \tag{25}$$

$$K_{s,k} = \rho^{\frac{1}{2}}\bar{K}_k(:,1)/R_{e,k}(1,1) \tag{26}$$

$$\begin{bmatrix}\bar{K}_{k+1}\\0\end{bmatrix} = \begin{bmatrix}0\\\bar{K}_k\end{bmatrix} - \rho^{-\frac{1}{2}}\tilde{L}_k R_{r,k}^{-1}\tilde{L}_k^T \check{C}_{k+1}^T \tag{27}$$

$$\tilde{L}_{k+1} = \rho^{-\frac{1}{2}}\tilde{L}_k - \begin{bmatrix}0\\\bar{K}_k\end{bmatrix}R_{e,k}^{-1}\check{C}_{k+1}\tilde{L}_k \tag{28}$$

$$R_{e,k+1} = R_{e,k} - \check{C}_{k+1}\tilde{L}_k R_{r,k}^{-1}\tilde{L}_k^T \check{C}_{k+1}^T \tag{29}$$

$$R_{r,k+1} = R_{r,k} - \tilde{L}_k^T \check{C}_{k+1}^T R_{e,k}^{-1}\check{C}_{k+1}\tilde{L}_k \tag{30}$$

Where, $$\check{C}_{k+1} = \begin{bmatrix}H_{k+1}\\\check{H}_{k+1}\end{bmatrix}, \tag{31}$$

$$\check{H}_{k+1} = [u_{k+1}u(k+1-N)] = [u(k+1)u_k],$$
$$\check{H}_1 = [u(1), 0, \ldots, 0]$$
$$R_{e,1} = R_1 + \check{C}_1\check{\Sigma}_{1|0}\check{C}_1^T,$$
$$R_1 = \begin{bmatrix}\rho & 0\\0 & -\rho\gamma_f^2\end{bmatrix},$$
$$\check{\Sigma}_{1|0} = \text{diag}\{\rho^2, \rho^3, \ldots, \rho^{N+2}\},$$
$$\rho = 1-\chi(\gamma_f)$$
$$\tilde{L}_0 = \begin{bmatrix}1 & 0\\0 & 0\\0 & 1\end{bmatrix} \in \mathcal{R}^{(N+1)\times 2},$$
$$R_{r,0} = \begin{bmatrix}-1 & 0\\0 & \rho^{-N}\end{bmatrix},$$
$$\bar{K}_0 = 0,$$
$$\hat{x}_{0|0} = \hat{x}_0,$$
$$\bar{K}_k = \rho^{-\frac{1}{2}}K_k$$

here,
$y_k$: the observation signal,
$F_k$: the dynamics of the system, $F_k=I$ for simplification,
$H_k$: the observation matrix,
$\hat{x}_{k|k}$: the estimated value of the state $x_k$ at the time k using the observation signals $y_0$ to $y_k$,
$K_{s,k}$: the filter gain, obtained from the gain matrix $\bar{K}_k$, and
$R_{e,k}, L_k$: an auxiliary variable,
a step at which the processing section stores an estimated value of the state $x_k$ by the hyper $H_\infty$ filter into the storage section;

a step at which the processing section calculates an existence condition based on the upper limit value $\gamma_f$ and the forgetting factor $\rho$ by the obtained observation matrix $H_i$ or the observation matrix $H_i$ and the filter gain $K_{s,i}$, and
a step at which the processing section decreases the upper limit value $\gamma_f$ by a factor of $\Delta\gamma$ and stores the resultant value into the storage section while the existence condition is satisfied in the step of executing the hyper $H_\infty$ filter,
wherein the $H_\infty$ filter equation is applied to obtain the state estimated value $\hat{x}_{k|K}=[\hat{h}_1[k],\ldots,\hat{h}_N[k]]^T$, where $\hat{h}[k]$ is the estimated value of impulse response,
a pseudo-echo is estimated by a following expression:

$$\hat{d}_k = \sum_{i=0}^{N-1}\hat{h}_i[k]u_{(k-i)}, \quad k=0,1,2,\ldots \tag{34}$$

and an actual echo is cancelled by the obtained pseudo-echo.

8. The system estimation method according to claim 1, wherein an estimated value $z^v_{k|k}$ of the output signal is obtained from the state estimated value $\hat{x}_{k|k}$ at the time k by a following expression:

$$z^v_{k|k}=H_k\hat{x}_{k|k}.$$

9. A system estimation program product, for a communication system or a sound system or sound field reproduction or noise control, embodied on a computer-readable medium and comprising code that, when executed, causes a computer to make state estimation robust and to optimize a forgetting factor $\rho$ simultaneously in an estimation algorithm, in which for a state space model expressed by following expressions:

$$x_{k+1}=F_kx_k+G_kw_k$$

$$y_k=H_kx_k+v_k$$

$$z_k=H_kx_k$$

here,
$x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix,
as an evaluation criterion, a maximum value of an energy gain which indicates a ratio of a filter error to a disturbance including the system noise $w_k$ and the observation noise $v_k$ and is weighted with the forgetting factor $\rho$ is suppressed to be smaller than a term corresponding to a previously given upper limit value $\gamma_f$, and
the system estimation program causes the computer to execute:
a step at which a processing section inputs the upper limit value $\gamma_f$, the observation signal $y_k$ as an input of a filter and a value including an observation matrix $H_k$ from a storage section or an input section;
a step at which the processing section determines the forgetting factor $\rho$ as a following function $\gamma_f$, $$\rho=1-\chi(\gamma_f)$$

where $\rho(\gamma_f)$ denotes a monotonicaly damping function of $\gamma_f$ to satisfy $\chi(1)=1$ and $\chi(\infty)=0$, a step of executing a hyper $H_\infty$ filter at which the processing section reads out an initial value or a value including the observation matrix $H_k$ at a time from the storage section and obtains a filter gain $K_{s,k}$ by using the forgetting factor $\rho$ and a gain matrix $\overline{K}_k$ and by following expressions:

$$\hat{x}_{k|k} = \hat{x}_{k-1|k-1} + K_{s,k}(y_k - H_k \hat{x}_{k-1|k-1}) \quad (25)$$

$$K_{s,k} = \rho^{\frac{1}{2}} \overline{K}_k(:,1)/R_{e,k}(1,1) \quad (26)$$

$$\begin{bmatrix} \overline{K}_{k+1} \\ 0 \end{bmatrix} = \begin{bmatrix} 0 \\ \overline{K}_k \end{bmatrix} - \rho^{-\frac{1}{2}} \tilde{L}_k R_{r,k}^{-1} \tilde{L}_k^T \breve{C}_{k+1}^T \quad (27)$$

$$\tilde{L}_{k+1} = \rho^{-\frac{1}{2}} \tilde{L}_k - \begin{bmatrix} 0 \\ \overline{K}_k \end{bmatrix} R_{e,k}^{-1} \breve{C}_{k+1} \tilde{L}_k \quad (28)$$

$$R_{e,k+1} = R_{e,k} - \breve{C}_{k+1} \tilde{L}_k R_{r,k}^{-1} \tilde{L}_k^T \breve{C}_{k+1}^T \quad (29)$$

$$R_{r,k+1} = R_{r,k} - \tilde{L}_k^T \breve{C}_{k+1}^T R_{e,k}^{-1} \breve{C}_{k+1} \tilde{L}_k \quad (30)$$

Where, $$\breve{C}_{k+1} = \begin{bmatrix} \breve{H}_{k+1} \\ \breve{H}_{k+1} \end{bmatrix}, \quad (31)$$

$$\breve{H}_{k+1} = [u_{k+1} u(k+1-N)] = [u(k+1) u_k],$$

$$\breve{H}_1 = [u(1), 0, \ldots, 0]$$

$$R_{e,1} = R_1 + \breve{C}_1 \breve{\Sigma}_{1|0} \breve{C}_1^T,$$

$$R_1 = \begin{bmatrix} \rho & 0 \\ 0 & -\rho \gamma_f^2 \end{bmatrix},$$

$$\breve{\Sigma}_{1|0} = \text{diag}\{\rho^2, \rho^3, \ldots, \rho^{N+2}\},$$

$$\rho = 1 - \chi(\gamma_f)$$

$$\tilde{L}_0 = \begin{bmatrix} 1 & 0 \\ 0 & 0 \\ 0 & 1 \end{bmatrix} \in \mathcal{R}^{(N+1) \times 2},$$

$$R_{r,0} = \begin{bmatrix} -1 & 0 \\ 0 & -\rho^N \end{bmatrix},$$

$$\overline{K}_0 = 0,$$

$$\hat{x}_{0|0} = \hat{x}_0,$$

$$\overline{K}_k = \rho^{-\frac{1}{2}} K_k$$

here,
$y_k$: the observation signal,
$F_k$: the dynamics of the system, $F_k = I$ for simplification,
$H_k$: the observation matrix,
$\hat{x}_{k|k}$: the estimated value of the state $x_k$ at the time k using the observation signals $y_0$ to $y_k$,
$K_{s,k}$: the filter gain, obtained from the gain matrix $\overline{K}_k$, and
$R_{e,k}, L_k$: an auxiliary variable,
a step at which the processing section stores an estimated value of the state $x_k$ by the hyper $H_\infty$ filter into the storage section;
a step at which the processing section calculates an existence condition based on the upper limit value $\gamma_f$ and the forgetting factor $\rho$ by the obtained observation matrix $H_i$ or the observation matrix $H_i$ and the filter gain $K_{s,i}$, and
a step at which the processing section decreases the upper limit value $\gamma_f$ by a factor of $\Delta\gamma$ and stores the resultant value into the storage section while the existence condition is satisfied in the step of executing the hyper $H_\infty$ filter;

wherein the $H_\infty$ filter equation is applied to obtain the state estimated value $\hat{x}_{k|K} = [\hat{h}_1[k], \ldots, \hat{h}_N[k]]^T$, where $\hat{h}[k]$ is the estimated value of impulse response,
a pseudo-echo is estimated by a following expression:

$$\hat{d}_k = \sum_{i=0}^{N-1} \hat{h}_i[k] u_{(k-i)}, \quad k = 0, 1, 2, \ldots \quad (34)$$

and an actual echo is cancelled by the obtained pseudo-echo.

10. A computer readable recording medium recording a system estimation program product, for a communication system or a sound system or sound field reproduction or noise control, embodied on a computer-readable medium and comprising code that, when executed, causes a computer to make state estimation robust and to optimize a forgetting factor $\rho$ simultaneously in an estimation algorithm, in which
for a state space model expressed by following expressions:

$$x_{k+1} = F_k x_k + G_k w_k$$

$$y_k = H_k x_k + v_k$$

$$z_k = H_k x_k$$

here,
$x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix,
as an evaluation criterion, a maximum value of an energy gain which indicates a ratio of a filter error to a disturbance including the system noise $w_k$ and the observation noise $v_k$ and is weighted with the forgetting factor $\rho$ is suppressed to be smaller than a term corresponding to a previously given upper limit value $\gamma_f$, and
the computer readable recording medium recording the system estimation program causes the computer to execute:
a step at which a processing section inputs the upper limit value $\gamma_f$, the observation signal $y_k$ as an input of a filter and a value including an observation matrix $H_k$ from a storage section or an input section;
a step at which the processing section determines the forgetting factor $\rho$ relevant to the state space model in accordance as a following function $\gamma_f$, $$\rho = 1 - \chi(\gamma_f)$$

where $\chi(\gamma_f)$ denotes a monotonicaly damping function of $\gamma_f$ to satisfy $\chi(1) = 1$ and $\chi(\infty) = 0$,
a step of executing a hyper $H_\infty$ filter at which the processing section reads out an initial value or a value including the observation matrix $H_k$ at a time from the storage section and obtains a filter gain $K_{s,k}$ by using the forgetting factor $\rho$ and a gain matrix $\overline{K}_k$ and by following expressions:

$$\hat{x}_{k|k} = \hat{x}_{k-1|k-1} + K_{s,k}(y_k - H_k \hat{x}_{k-1|k-1}) \quad (25)$$

$$K_{s,k} = \rho^{\frac{1}{2}} \overline{K}_k(:,1)/R_{e,k}(1,1) \quad (26)$$

-continued $$\begin{bmatrix} \overline{K}_{k+1} \\ 0 \end{bmatrix} = \begin{bmatrix} 0 \\ \overline{K}_k \end{bmatrix} - \rho^{-\frac{1}{2}} \tilde{L}_k R_{r,k}^{-1} \tilde{L}_k^T \breve{C}_{k+1}^T \quad (27)$$

$$\tilde{L}_{k+1} = \rho^{-\frac{1}{2}} \tilde{L}_k - \begin{bmatrix} 0 \\ \overline{K}_k \end{bmatrix} R_{e,k}^{-1} \breve{C}_{k+1} \tilde{L}_k \quad (28)$$

$$R_{e,k+1} = R_{e,k} - \breve{C}_{k+1} \tilde{L}_k R_{r,k}^{-1} \tilde{L}_k^T \breve{C}_{k+1}^T \quad (29)$$

$$R_{r,k+1} = R_{r,k} - \tilde{L}_k^T \breve{C}_{k+1}^T R_{e,k}^{-1} \breve{C}_{k+1} \tilde{L}_k \quad (30)$$

Where, $$\breve{C}_{k+1} = \begin{bmatrix} \breve{H}_{k+1} \\ \breve{H}_{k+1} \end{bmatrix}, \quad (31)$$

$$\breve{H}_{k+1} = [u_{k+1} u(k+1-N)] = [u(k+1)\, u_k],$$

$$\breve{H}_1 = [u(1), 0, \ldots, 0]$$

$$R_{e,1} = R_1 + \breve{C}_1 \breve{\Sigma}_{1|0} \breve{C}_1^T,$$

$$R_1 = \begin{bmatrix} \rho & 0 \\ 0 & -\rho \gamma_f^2 \end{bmatrix},$$

$$\breve{\Sigma}_{1|0} = \text{diag}\{\rho^2, \rho^3, \ldots, \rho^{N+2}\},$$

$$\rho = 1 - \chi(\gamma_f)$$

$$\tilde{L}_0 = \begin{bmatrix} 1 & 0 \\ 0 & 0 \\ 0 & 1 \end{bmatrix} \in \mathcal{R}^{(N+1)\times 2},$$

$$R_{r,0} = \begin{bmatrix} -1 & 0 \\ 0 & \rho^{-N} \end{bmatrix},$$

$$\overline{K}_0 = 0, \quad \hat{x}_{0|0} = \breve{x}_0, \quad \overline{K}_k = \rho^{-\frac{1}{2}} K_k$$

here, $y_k$: the observation signal,
$F_k$: the dynamics of the system, $F_k = I$ for simplification,
$H_k$: the observation matrix,
$\hat{x}_{k|k}$: the estimated value of the state $x_k$ at the time k using the observation signals $y_0$ to $y_k$,
$K_{s,k}$: the filter gain, obtained from the gain matrix $K^-_k$, and
$R_{e,k}, L_k$: an auxiliary variable, a step at which the processing section stores an estimated value of the state $x_k$ by the hyper $H_\infty$ filter into the storage section;

a step at which the processing section calculates an existence condition based on the upper limit value $\gamma_f$ and the forgetting factor $\rho$ by the obtained observation matrix $H_i$ or the observation matrix $H_i$ and the filter gain $K_{s,i}$, and a step at which the processing section decreases the upper limit value $\gamma_f$ by a factor of $\Delta\gamma$ and stores the resultant value into the storage section while the existence condition is satisfied in the step of executing the hyper $H_\infty$ filter, wherein the $H_\infty$ filter equation is applied to obtain the state estimated value $\hat{x}_{k|K} = [\hat{h}_1[k], \ldots, \hat{h}_N[k]]^T$, where $\hat{h}[k]$ is the estimated value of impulse response, a pseudo-echo is estimated by a following expression:

$$\hat{d}_k = \sum_{i=0}^{N-1} \hat{h}_i[k] u_{(k-i)}, \quad k = 0, 1, 2, \ldots \quad (34)$$

and an actual echo is cancelled by the obtained pseudo-echo.

11. A system estimation device, for communication system or a sound system or sound field reproduction or noise control, for making state estimation robust and optimizing a forgetting factor $\rho$ simultaneously in an estimation algorithm, in which for a state space model expressed by following expressions:

$$x_{k+1} = F_k x_k + G_k w_k$$

$$y_k = H_k x_k + v_k$$

$$z_k = H_k x_k$$

here, $x_k$: a state vector or simply a state,
$w_k$: a system noise,
$v_k$: an observation noise,
$y_k$: an observation signal,
$z_k$: an output signal,
$F_k$: dynamics of a system, and
$G_k$: a drive matrix, as an evaluation criterion, a maximum value of an energy gain which indicates a ratio of a filter error to a disturbance including the system noise $w_k$ and the observation noise $v_k$ and is weighted with the forgetting factor $\rho$ is suppressed to be smaller than a term corresponding to a previously given upper limit value $\gamma_f$, and the system estimation device comprises:

a processing section to execute the estimation algorithm; and a storage section to which reading and/or writing is performed by the processing section and which stores respective observed values, set values, and estimated values relevant to the state space model, further comprising:

a means at which the processing section inputs the upper limit value $\gamma_f$, the observation signal $y_k$ as an input of a filter and a value including an observation matrix $H_k$ from the storage section or an input section;

a means at which the processing section determines the forgetting factor $\rho$ as a following function $\gamma_f$, $$\rho = 1 - \chi(\gamma_f)$$

where $\chi(\gamma_f)$ denotes a monotonicaly damping function of $\gamma_f$ to satisfy $\chi(1)=1$ and $\chi(\infty)=0$, a means of executing a hyper $H_\infty$ filter at which the processing section reads out an initial value or a value including the observation matrix $H_k$ at a time from the storage section and obtains a filter gain $K_{s,k}$ by using the forgetting factor $\rho$ and a gain matrix $K^-_k$ and by following expressions:

$$\hat{x}_{k|k} = \hat{x}_{k-1|k-1} + K_{s,k}(y_k - H_k \hat{x}_{k-1|k-1}) \quad (25)$$

$$K_{s,k} = \rho^{\frac{1}{2}} \overline{K}_k(:,1) / R_{e,k}(1,1) \quad (26)$$

$$\begin{bmatrix} \overline{K}_{k+1} \\ 0 \end{bmatrix} = \begin{bmatrix} 0 \\ \overline{K}_k \end{bmatrix} - \rho^{-\frac{1}{2}} \tilde{L}_k R_{r,k}^{-1} \tilde{L}_k^T \breve{C}_{k+1}^T \quad (27)$$

$$\tilde{L}_{k+1} = \rho^{-\frac{1}{2}} \tilde{L}_k - \begin{bmatrix} 0 \\ \overline{K}_k \end{bmatrix} R_{e,k}^{-1} \breve{C}_{k+1} \tilde{L}_k \quad (28)$$

$$R_{e,k+1} = R_{e,k} - \breve{C}_{k+1} \tilde{L}_k R_{r,k}^{-1} \tilde{L}_k^T \breve{C}_{k+1}^T \quad (29)$$

-continued $$R_{r,k+1} = R_{r,k} - \tilde{L}_k^T \breve{C}_{k+1}^T R_{e,k}^{-1} \breve{C}_{k+1} \tilde{L}_k \qquad (30)$$

Where, $$\breve{C}_{k+1} = \begin{bmatrix} \breve{H}_{k+1} \\ \breve{H}_{k+1} \end{bmatrix}, \qquad (31)$$

$$\breve{H}_{k+1} = [u_{k+1} u(k+1-N)] = [u(k+1)\, u_k],$$

$$\breve{H}_1 = [u(1), 0, \ldots, 0]$$

$$R_{e,1} = R_1 + \breve{C}_1 \breve{\Sigma}_{1|0} \breve{C}_1^T,$$

$$R_1 = \begin{bmatrix} \rho & 0 \\ 0 & -\rho \gamma_f^2 \end{bmatrix},$$

$$\breve{\Sigma}_{1|0} = \mathrm{diag}\{\rho^2, \rho^3, \ldots, \rho^{N+2}\},$$

$$\rho = 1 - \chi(\gamma_f)$$

$$\tilde{L}_0 = \begin{bmatrix} 1 & 0 \\ 0 & 0 \\ 0 & 1 \end{bmatrix} \in \mathcal{R}^{(N+1) \times 2},$$

$$R_{r,0} = \begin{bmatrix} -1 & 0 \\ 0 & \rho^{-N} \end{bmatrix},$$

$$\overline{K}_0 = 0,\ \hat{x}_{0|0} = \overline{x}_0,\ \overline{K}_k = \rho^{-\frac{1}{2}} K_k$$

here,
- $y_k$: the observation signal,
- $F_k$: the dynamics of the system, $F_k = I$ for simplification,
- $H_k$: the observation matrix,
- $\hat{x}_{k|k}$: the estimated value of the state $x_k$ at the time k using the observation signals $y_0$ to $y_k$,
- $K_{s,k}$: the filter gain, obtained from the gain matrix $K^-_k$, and
- $R_{e,k}$, $L_k$: an auxiliary variable, a means at which the processing section stores an estimated value of the state $x_k$ by the hyper $H_\infty$ filter into the storage section;

a means at which the processing section calculates an existence condition based on the upper limit value $\gamma_f$ and the forgetting factor $\rho$ by the obtained observation matrix $H_i$ or the observation matrix $H_i$ and the filter gain $K_{s,i}$ and a means at which the processing section decreases the upper limit value $\gamma_f$ by a factor of $\Delta\gamma$ and stores the resultant value into the storage section while the existence condition is satisfied in the means of executing the hyper $H_\infty$ filter, wherein the $H_\infty$ filter equation is applied to obtain the state estimated value $\hat{x}_{k|K} = [\hat{h}_1[k], \ldots, \hat{h}_N[k]]^T$, where $\hat{h}[k]$ is the estimated value of impulse response, a pseudo-echo is estimated by a following expression:

$$\hat{d}_k = \sum_{i=0}^{N-1} \hat{h}_i[k] u_{(k-i)}, \quad k = 0, 1, 2, \ldots \qquad (34)$$

and an actual echo is cancelled by the obtained pseudo-echo.

12. The system estimation method according to claim 5, wherein the processing section calculates the existence condition in accordance with a following expression:

$$-\varrho \hat{\Xi}_i + \rho \gamma_f^2 > 0,\ i = 0, \ldots, k \qquad (18)$$

here, $$\varrho = 1 - \gamma_f^2,\ \hat{\Xi}_i = \frac{\rho H_i K_{s,i}}{1 - H_i K_{s,i}},\ \rho = 1 - \chi(\gamma_f) \qquad (19)$$

where the forgetting factor $\rho$ and the upper limit value $\gamma_f$ have a following relation:

$0 < \rho = 1 - \chi(\gamma_f) \leq 1$, where $\chi(\gamma_f)$ denotes a monotonically damping function of $\gamma_f$ to satisfy $\chi(1) = 1$ and $\chi(\infty) = 0$.

13. The system estimation method according to claim 5, wherein an estimated value $z^v_{k|k}$ of the output signal is obtained from the state estimated value $\hat{x}_{k|k}$ at the time k by a following expression:

$$z^v_{k|k} = H_k \hat{x}_{k|K}.$$

14. The system estimation method according to claim 7, wherein the processing section calculates the existence condition in accordance with a following expression:

$$-\varrho \hat{\Xi}_i + \rho \gamma_f^2 > 0,\ i = 0, \ldots, k \qquad (18)$$

here, $$\varrho = 1 - \gamma_f^2,\ \hat{\Xi}_i = \frac{\rho H_i K_{s,i}}{1 - H_i K_{s,i}},\ \rho = 1 - \chi(\gamma_f) \qquad (19)$$

where the forgetting factor $\rho$ and the upper limit value $\gamma_f$ have a following relation:

$0 < \rho = 1 - \chi(\gamma_f) \leq 1$, where $\chi(\gamma_f)$ denotes a monotonically damping function of $\gamma_f$ to satisfy $\chi(1) = 1$ and $\chi(\infty) = 0$.

15. The system estimation method according to claim 7, wherein an estimated value $z^v_{k|k}$ of the output signal is obtained from the state estimated value $\hat{x}_{k|k}$ at the time k by a following expression:

$$z^v_{k|k} = H_k \hat{x}_{k|k}.$$

* * * * *